(12) United States Patent
Hokenmaier et al.

(10) Patent No.: US 10,360,971 B1
(45) Date of Patent: Jul. 23, 2019

(54) ARTIFICIAL NEURAL NETWORK FUNCTIONALITY WITHIN DYNAMIC RANDOM-ACCESS MEMORY

(71) Applicant: Green Mountain Semiconductor, Inc., Burlington, VT (US)

(72) Inventors: Wolfgang Hokenmaier, Burlington, VT (US); Jacob Bucci, Burlington, VT (US); Ryan Jurasek, South Burlington, VT (US)

(73) Assignee: Green Mountain Semiconductor, Inc., Burlington, VT (US)

(*) Notice: Subject to any disclaimer, the term of this patent is extended or adjusted under 35 U.S.C. 154(b) by 0 days.

(21) Appl. No.: 15/961,599

(22) Filed: Apr. 24, 2018

Related U.S. Application Data

(63) Continuation-in-part of application No. 15/342,111, filed on Nov. 2, 2016, now Pat. No. 10,002,658.

(60) Provisional application No. 62/607,466, filed on Dec. 19, 2017, provisional application No. 62/489,067, filed on Apr. 24, 2017, provisional application No. 62/249,675, filed on Nov. 2, 2015.

(51) Int. Cl.
*G11C 7/00* (2006.01)
*G11C 11/4091* (2006.01)
*G06N 3/04* (2006.01)
*G06N 3/08* (2006.01)
*G11C 11/4094* (2006.01)

(52) U.S. Cl.
CPC ........ *G11C 11/4091* (2013.01); *G06N 3/0454* (2013.01); *G06N 3/08* (2013.01); *G11C 11/4094* (2013.01)

(58) Field of Classification Search
CPC ............ G11C 11/4091; G11C 11/4094; G06N 3/0454; G06N 3/08
USPC .......................................................... 365/203
See application file for complete search history.

(56) References Cited

U.S. PATENT DOCUMENTS

| | | | |
|---|---|---|---|
| 8,976,893 B2 | 3/2015 | Bai | |
| 9,430,735 B1* | 8/2016 | Vali | ........................ G06N 3/04 |
| 9,451,899 B2 | 9/2016 | Ritchey et al. | |
| 9,679,241 B2 | 6/2017 | Nugent et al. | |
| 2009/0086071 A1 | 4/2009 | Kagawa et al. | |
| 2012/0259804 A1* | 10/2012 | Brezzo | ................... G06N 3/049 |
| | | | 706/25 |
| 2014/0133251 A1 | 5/2014 | Takahashi et al. | |
| 2015/0324692 A1 | 11/2015 | Ritchey et al. | |

(Continued)

*Primary Examiner* — Vu A Le
(74) *Attorney, Agent, or Firm* — Adams Intellex, PLC

(57) ABSTRACT

Techniques are disclosed for artificial neural network functionality within dynamic random-access memory. A plurality of dynamic random-access cells is accessed within a memory block. Data within the plurality of dynamic random-access cells is sensed using a plurality of sense amplifiers associated with the plurality of dynamic random-access cells. A plurality of select lines coupled to the plurality of sense amplifiers is activated to facilitate the sensing of the data within the plurality of dynamic random-access cells, wherein the activating is a function of inputs to a layer within a neural network, and wherein a bit within the plurality of dynamic random-access cells is sensed by a first sense amplifier and a second sense amplifier within the plurality of sense amplifiers. Resulting data is provided based on the activating wherein the resulting data is a function of weights within the neural network.

26 Claims, 14 Drawing Sheets

(56) References Cited

U.S. PATENT DOCUMENTS

| | | |
|---|---|---|
| 2017/0161605 A1 | 6/2017 | Kumar et al. |
| 2017/0213134 A1 | 7/2017 | Beyeler et al. |
| 2017/0270410 A1 | 9/2017 | Denham |
| 2017/0329575 A1 | 11/2017 | Gu et al. |
| 2017/0372197 A1 | 12/2017 | Baughman et al. |
| 2018/0046908 A1 | 2/2018 | Cox et al. |
| 2018/0053550 A1 | 2/2018 | Rakshit et al. |
| 2018/0082176 A1 | 3/2018 | Wu et al. |
| 2018/0095930 A1 | 4/2018 | Lu et al. |

* cited by examiner

ARTIFICIAL NEURAL NETWORK FUNCTIONALITY WITHIN DYNAMIC RANDOM-ACCESS MEMORY

RELATED APPLICATIONS

This application claims the benefit of U.S. provisional patent applications "A Highly Configurable, Single Die, Digital, Artificial Neural Network Architecture Utilizing Dynamic Random Access Memory" Ser. No. 62/489,067, filed Apr. 24, 2017 and "Dynamic Random Access Memory with Combinational Multiplication Data Processing Architecture" Ser. No. 62/607,466, filed Dec. 19, 2017. This application is also a continuation-in-part of U.S. patent application "Dynamic Random-Access Memory with Embedded Artificial Neural Network Functionality" Ser. No. 15/342,111, filed Nov. 2, 2016, which claims the benefit of U.S. provisional patent applications "Highly Configurable Artificial Neural Network Architecture" Ser. No. 62/249,675, filed Nov. 2, 2015. Each of the foregoing applications is hereby incorporated by reference in its entirety.

FIELD OF ART

The present disclosure relates generally to the field of neural network systems and particularly to artificial neural network functionality within dynamic random-access memory.

BACKGROUND

Architectures based on artificial neural networks (ANN) are increasingly being used as preferred alternatives to von Neumann or Harvard style processor architectures for many computational applications. Indeed, ANN architectures are already used in many applications such as pattern recognition, voice and image recognition, business analytics, safety and security, and so on. ANNs typically comprise interconnected sets of nodes that can act like and are often referred to as their biological analogs, "neurons." Each neuron has an output, frequently referred to as an "axon," and one or more inputs provided via connections often called "synapses." The synapses typically have associated weights or coefficients which amplify or otherwise modify the signals carried by the synapses and/or received by the neuron. The neuron typically sums the signals of all "upstream" connected synapses (i.e., synapses that provide inputs to the neuron) and any bias applied to the neuron. Through an activation function, the neuron changes the output axon, which may then be provided via one or more "downstream" synapses to subsequent neurons or as an output of the ANN. The result is a network that can process incoming signals and drive output signals.

Mathematical representations of ANNs have been implemented in software with some success and are used in areas such as object detection, voice recognition, and data mining applications, among many others. Software-implemented ANNs are dynamic in that they can be "trained" to solve many different problems. The ANNs can be trained using techniques such as supervised training, where datasets are provided that include objects, voices, images, and so on. Software implemented ANNs can be more efficient than traditional coding algorithms, particularly in terms of the ability of the ANN to be modified or retrained; but there is still a significant gap in performance of a trained ANN relative to an optimal ANN. A common way of implementing a high-performance ANN in a semiconductor technology is to train a specific network for a specific task, and then hard-code that solution directly into the semiconductor technology. While this technique can produce high computing efficiency for a particular implementation, it further results in a subsequent inability to reconfigure the network by changing weights, biases, or interconnections between neurons, or by adding or removing neurons. Other ANNs use memory elements such as SRAM or volatile registers to create an ANN that can be programmed. However, these memory elements are physically large, they limit the feasible size of the ANN, and they may also limit the flexibility of the connections between neurons.

SUMMARY

Dynamic random-access memory (DRAM) is a ubiquitous form of electronic storage used in a wide variety of electronic devices. DRAM is organized in large arrays of memory elements or cells, plus the ancillary circuitry to support reading and writing. Unlike static random-access memory (SRAM), which stores data actively using techniques such as cross-coupled inverters, DRAM stores data passively, on capacitors, within the memory structure. The principal advantages of using DRAM are twofold: DRAM is denser than SRAM so it can store more data per unit area, and DRAM is relatively inexpensive in terms of cost and power consumption. Like SRAMs, DRAMs support writing and reading of data. However, data storage within a DRAM is volatile. Charge on a capacitor, particularly on the nanometer-scale capacitors within the DRAM cells, leak charge. As a result, data within a DRAM must be rewritten or refreshed regularly to maintain the integrity of the data. Further, reading data from the DRAM disturbs the contents of the memory cells. Thus a read operation performed on a DRAM cell requires a rewrite operation to restore the data contents.

In one aspect, the present disclosure provides a platform for an artificial neural network that can be run at high speed with low power requirements. In some embodiments, user configurable neuron connections and/or a user configurable function selection for one or more neurons can be enabled. By using a high density and highly parallel memory architecture, as can typically be found in state-of-the-art dynamic random-access memory, the teachings herein provide a framework for implementing very large and highly configurable neural networks. The neural network may be fully contained within the memory device itself, thus eliminating the transfer of data such as weights associated with synapse inputs. In an embodiment, intermediate layers and neuron connectivity information may also be fully integrated into the ANN-enabled memory device, further reducing the chip-external communication to a minimum. The memory device may retain random access write functions sufficient to program a trained neural network into the memory device. The memory device may also retain random access read and write functions in order to train the neural network in situ.

Data calculation is performed for artificial neural network functionality within dynamic random-access memory. Embodiments include a method for data calculation comprising: accessing a plurality of dynamic random-access cells within a memory block; sensing data within the plurality of dynamic random-access cells using a plurality of sense amplifiers associated with the plurality of dynamic random-access cells; activating a plurality of select lines coupled to the plurality of sense amplifiers to facilitate the sensing of the data within the plurality of dynamic random-access cells wherein the activating is a function of inputs to a layer within a neural network, wherein a bit within the plurality of dynamic random-access cells is sensed by a first sense amplifier and a second sense amplifier within the plurality of sense amplifiers; and providing resulting data based on the activating wherein the resulting data is a function of weights within the neural network.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
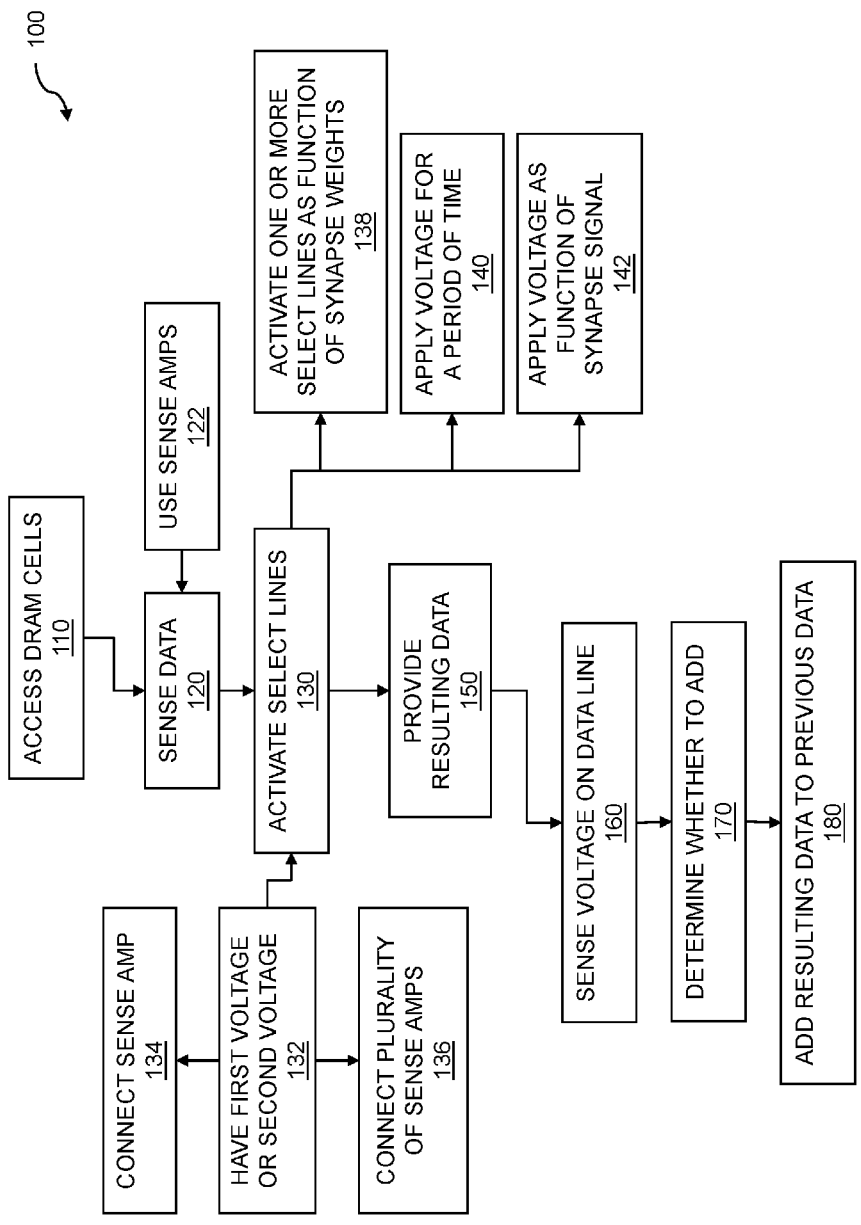
FIG. 1 is a flow diagram for artificial neural network functionality within a dynamic random-access memory (DRAM).

Techniques are disclosed for artificial neural network functionality within dynamic random-access memory. The techniques increase the flexibility of artificial neural network (ANN) development while still allowing a high number of neurons to be used. In particular, embodiments herein are directed to dynamic random-access memory (DRAM) with embedded ANN functionality. Aspects of the present disclosure can be used to implement standalone, embedded, or complementary systems, among others, that can quickly and easily implement ANN solutions. Although aspects of the present disclosure are directed to DRAM with embedded ANN functionality, practical uses of the inventive subject matter disclosed herein can extend far beyond DRAM integrated circuits. For example, a central processing unit, video processing unit, or other computing device may be developed or modified to take advantage of the teachings disclosed herein. Further, self-driving vehicles, manually or semi-autonomously controlled vehicles, power generation or distribution systems, security systems, and/or a vast array of other large, complex systems may benefit from the teachings provided herein, as will be appreciated by those of ordinary skill in the art after reading this disclosure in its entirety.

In some embodiments, ANNs implemented in accordance with the teachings herein can be used as a basis for a readily reprogrammable computing component in self-driving or semi-autonomously controlled vehicles. For example, at the time of manufacture, a vehicle manufacturer may include computer vision functionality in an automobile, ship, or other vehicle, e.g., to recognize road hazards, undersea hazards, weather hazards, or otherwise to assist a driver or autopilot function with safely and efficiently navigating routes. However, the computer vision configuration may need to be modified at a later date, which may require a recall to be issued and one or more parts to be physically replaced. By utilizing aspects of the present disclosure, many such situations can be avoided, as the solutions provided herein not only enable a very efficient neural network to be developed but also enable that neural network to be updated as appropriate without requiring hardware to be physically replaced. This not only enables high-performance neural networks with large memory capacity but also reduces expenses for manufacturers when neural networks need to be updated in existing products.

ANNs use memory in order to hold the value of each of the weights on both the synapses and the biases for the neurons. The weights and biases often need to be updated, because training an ANN is an iterative process. As such, memory used with ANNs should have a high, and preferably infinite, endurance. The memory should also be dense to allow for the high number of weights and biases typically needed for a large ANN. Further, the memory should have a short random-access capability so that various weights, biases, and axons can be updated and evaluated quickly in order to deliver a high-performance ANN. Given these constraints, the present inventors have determined that a modified DRAM memory architecture, which typically utilizes just one transistor and one capacitor, is a viable choice to meet these requirements.

FIG. 1 is a flow diagram for artificial neural network functionality within a dynamic random-access memory (DRAM). The flow 100 includes accessing a plurality of dynamic random-access cells within a memory block. Analogous to other memory architectures, a DRAM architecture includes storage cells for holding data. The data is stored as voltages that are used to represent values such as binary ones and zeros. The cells are organized in rows and columns such that a plurality of cells may be addressed or accessed together. For example, a given address within the DRAM may access a row of cells 110 or a portion of a row of cells. A row of cells can include logical groupings of cells such as bytes, words, and so on. DRAM cells differ from other memory cell types in that data is stored capacitively rather than actively such as in SRAM. A variety of techniques can be used for accessing the DRAM cells. In embodiments, the accessing of the plurality of dynamic random-access cells can be accomplished by data compare. A data compare can be used to compare an address, a value, etc., to a table of stored data. The compare can return an address for stored data, the stored data, and so on, depending on the type of compare technique. In embodiments, the data compare can include a content-addressable memory access. The content addressable memory access can return an address, for example. The data compare can be used for row activation as part of the accessing the plurality of dynamic random-access cells. When the compare results in a match, the row of the DRAM referenced by the match can be activated.

The flow 100 includes sensing data 120 within the plurality of dynamic random-access cells. The sensing can be accomplished using a plurality of sense amplifiers 122 associated with the plurality of dynamic random-access cells. The plurality of DRAM cells that are accessed transfer their contents to local data lines. Since the contents of the cells are stored on capacitors, the contents of the cells slightly perturb voltages previously on the local data lines. The sense amplifiers are used to detect those small perturbations and to determine whether the content of a given cell was a value such as a logical one or a logical zero. Since the sensing of a DRAM cell sufficiently changes or depletes the voltage on the cell capacitor, the sense amp further rewrites the contents of the cell back to the cell, thus restoring the stored value as a voltage on the cell capacitor.

The flow 100 includes activating a plurality of select lines 130 coupled to the plurality of sense amplifiers. This facilitates the sensing of the data within the plurality of dynamic random-access cells wherein the activating is a function of inputs to a layer within a neural network wherein a bit within the plurality of dynamic random-access cells is sensed by a first sense amplifier and a second sense amplifier within the plurality of sense amplifiers. As discussed elsewhere, a given select line can activate a data switch of a sense amplifier to transfer the sensed contents of a DRAM cell onto a local data line and a complement local data line. In embodiments, the data compare discussed above can be used for the activating the plurality of select lines. That is, when a match is found between input data or address data and stored data in a table of contents, a plurality of select lines may be activated. In embodiments, the select lines can be driven sequentially (i.e. serially) or simultaneously (i.e. in parallel) such that a signal on a shared line is modified by the first sense amplifier and the second sense amplifier before the shared line is reset or pre-charged. At least one of the select lines can be configured to be driven by a signal selectively having a first voltage or a second voltage 132. The voltage values can be high or low voltage, where the voltage values are appropriate to the DRAM. The first voltage can be utilized for connecting one sense amplifier 134 to the shared line for sensing one single bit per shared line and the second voltage can be used for connecting a plurality of sense amplifiers 136 simultaneously to the same shared line. In this way the shared line carries an analog signal directly dependent on data stored in the plurality of memory cells associated with the connected plurality of sense amplifiers. The connecting of a sense amplifier to a shared line can be accomplished using a switch. In embodiments, an n-type transistor can be used to connect the sense amplifier to the shared line, where the first voltage is higher than the second voltage and where an n-type transistor is used to connect the first sense amplifier to the shared line. In other embodiments, a p-type transistor is used to connect the sense amplifier to the shared line, wherein the first voltage is lower than the second voltage.

The flow 100 further includes activating one or more select lines from the plurality of select lines such that a voltage is applied to a data line as a function of one or more synapse weights 138. A synapse weight can be a weight, a scale, an adjustment, and so on, of an amplitude. The amplitude can be applied to a connection between nodes or neurons of a neural network. In embodiments, synapse weights can be stored in a plurality of memory cells, such as the plurality of memory cells of a DRAM. The flow 100 further includes applying a voltage to at least one of the select lines for a period of time 140, wherein the period of time is determined as a function of a synapse input signal. The period of time can be a function of amplitude of the synapse signal such as a short period of time for a low amplitude, a long period of time for a high amplitude, and so on. The flow 100 further includes applying a voltage to at least one of the select lines, wherein the voltage is determined as a function of a synapse input signal 142. The voltage that is determined can fall within a range of voltage values, such as a high voltage value, a low voltage value, an intermediate voltage value, and the like.

The flow 100 includes providing resulting data 150 based on the activating where the resulting data is a function of weights within the neural network. The data can include the output of a final layer of a neural network, such as an artificial neural network (ANN), a convolutional neural network (CNN), etc. The resulting data can be stored in the DRAM, transferred to another ANN for further processing, and the like. In embodiments, the resulting data can include neuromorphic computing data. Neuromorphic computing, and the data that it processes, can represent computing approaches that are modeled after the biological activity of a brain. Neuromorphic computing is particularly well suited to high order computational tasks such as visual processing of images, deep learning, etc. In embodiments, the accessing, sensing, activating, and providing comprise neuromorphic computing processes.

The flow 100 further includes sensing a voltage on the data line 160. The sensing a voltage can include determining whether the voltage can represent a digital or binary value, or an analog value. The value can correspond to a weight such as a synapse weight. The flow 100 includes determining whether to add 170 a value to an accumulator register as a function of the sensed voltage. The adding a value to an accumulator can serve a variety of purposes. In the context of multiplication, the value, such as a partial product, can be added to previously computed partial products. The result of adding all partial products generated by multiplication is the product. In the context of a neural network, the adding a value to an accumulator can include synaptic evaluation within the neural network. As discussed elsewhere, synaptic evaluation can include multiplying an input vector by a matrix of weights to compute an output vector. The flow 100 further includes adding the resulting data to previous data 180 that was obtained through accessing the plurality of dynamic random-access cells. If the value of the data represented by the voltage is zero, which could be the case when a weight for a bit is also zero, nothing is added to the accumulator. If the value of the data is one, however, an accumulator can increment its value by (or as a function of) the data value multiplied by the significance of the bit assigned to the corresponding CSL. Various steps in the flow 100 may be changed in order, repeated, omitted, or the like without departing from the disclosed concepts.

Figure 2:
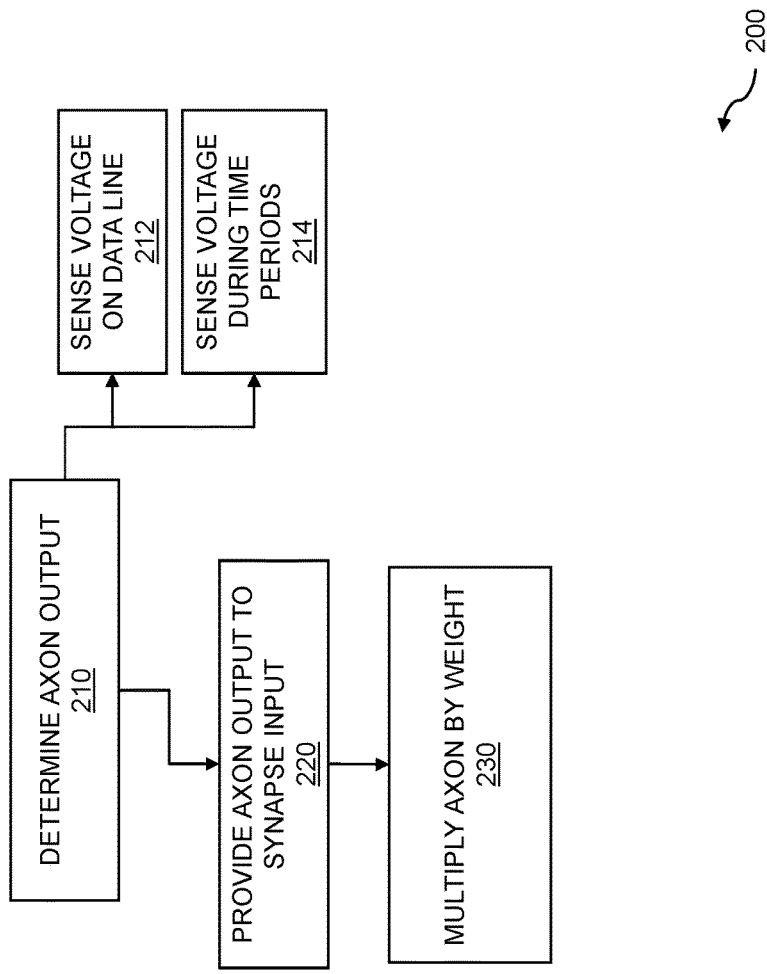
FIG. 2 is a flow diagram for axon manipulation.

FIG. 2 is a flow diagram for axon manipulation. A neuron of an artificial neural network receives inputs. The inputs can be summed to produce an output or activation. The output or axon can be transmitted to another neuron along a path or synapse. Manipulation of one or more axons supports artificial neural network functionality within dynamic random-access memory. A plurality of dynamic random-access cells is accessed within a memory block, and data within the plurality of dynamic random-access cells is sensed using a plurality of sense amplifiers. A plurality of select lines coupled to the plurality of sense amplifiers are activated to facilitate the sensing of the data within the plurality of DRAM cells. The activating is a function of inputs to a layer within a neural network where a bit within the DRAM cells is sensed by both a first and a second sense amplifier. Resulting data is provided based on the activating. The resulting data is a function of weights within the neural network.

The flow 200 includes determining an axon output 210 as a function of a select line voltage where the select line is from the plurality of select lines. The select lines of the DRAM can be driven sequentially or simultaneously. The select lines can be driven such that a signal on a shared line is modified by the first sense amplifier and the second sense amplifier before the shared line is reset or pre-charged, thus permitting time to capture the modified signal on the shared line. At least one of the select lines can be configured to be driven by a signal selectively having a first voltage or a second voltage. The first voltage or the second voltage can be a high voltage or a low voltage, where the high voltage or the low voltage is appropriate to the technology of the DRAM. The first voltage can be utilized for connecting one sense amplifier to the shared line for sensing one single bit per shared line. The second voltage can be used for connecting a plurality of sense amplifiers simultaneously to the same shared line such that the shared line carries an analog signal. The analog signal can be directly dependent on data stored in the plurality of memory cells associated with the connected plurality of sense amplifiers. In embodiments, the determining an axon output includes sensing a voltage on the data line 212 during a plurality of separated time periods before the data line is reset or pre-charged. The sensed voltage can represent a one, a zero, or an intermediate value. In other embodiments, the determining the axon output further includes sensing a voltage on one of the select lines during a plurality of separated time periods 214 before the select line is reset or pre-charged. The resetting or pre-charging the selected lines replaces whatever axon output was on the lines prior to resetting or pre-charging.

The flow 200 includes providing the axon output to a synapse input 220. The axon output can be the output of a neuron of one layer within the artificial neural network, and the synapse input can be the input to a neuron of a subsequent layer within the artificial neural network. When the two layers are fully connected layers, the axon output can be connected to a synapse input of each node of the subsequent layer. The flow 200 includes multiplying the axon output by a weight 230 associated with one of the select lines. The multiplying can include a scaling factor or the like. In embodiments, the weight can correspond to a significance of the one of the select lines. Various steps in the flow 200 may be changed in order, repeated, omitted, or the like without departing from the disclosed concepts.

Figure 3:
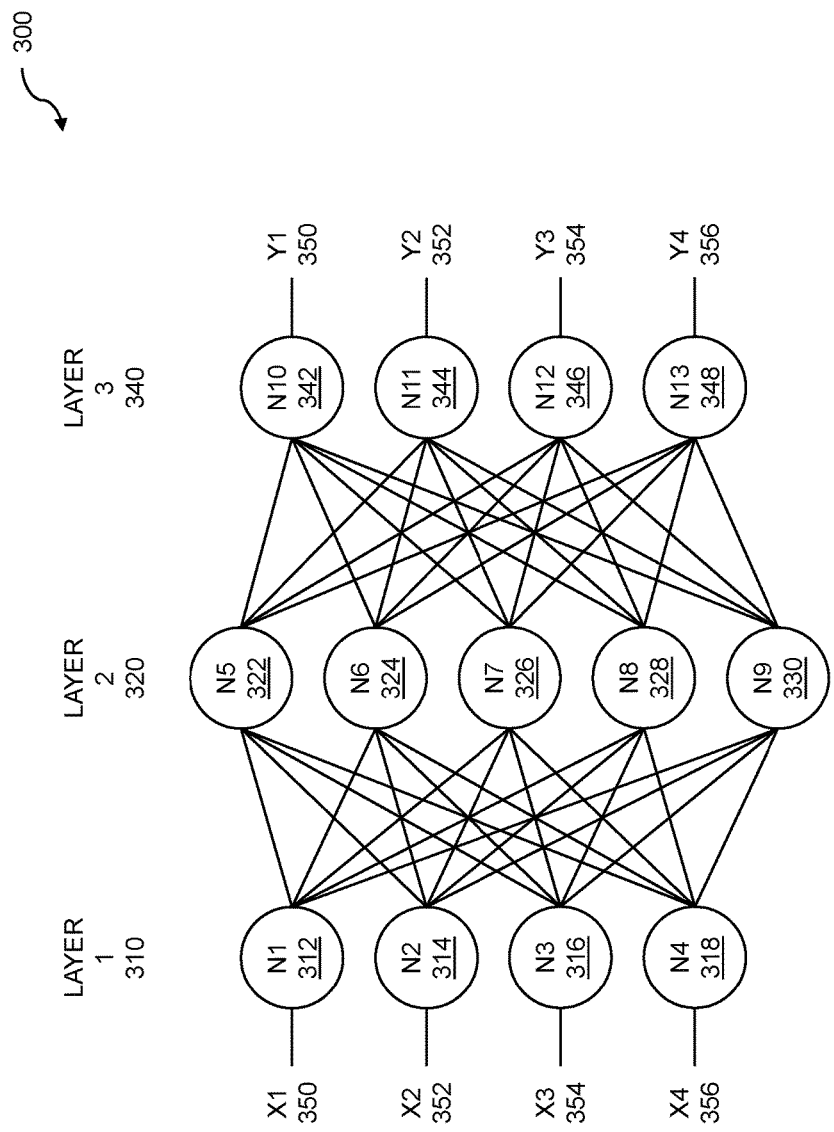
FIG. 3 shows a simple neural network.

FIG. 3 shows a simple neural network 300. A neural network, such as an artificial neural network (ANN), a convolutional neural network (CNN), and so on, can be used to perform a variety of computational tasks such as learning. Artificial neural network functionality can be supported within a dynamic random-access memory. A typical DRAM utilizes both row activates and column accesses. When performing a row activate, a wordline connected to the gate of a cell transfer device is selected and data is transferred from the DRAM capacitor to the bitline, where a latch circuit known as a "sense amplifier" amplifies and holds the data. Typically, this is done for many cells in parallel, as a DRAM has a destructive read and any cell to which the selected wordline connects must then be captured by a sense amplifier or its data will be lost. During a column access, a column select line (CSL) is driven to a specific sense amplifier. The data from the sense amplifier is then transferred to a local data line (LDL), usually through a transfer transistor. The data is further transferred to another data line and eventually may be driven off the chip.

An ANN-enabled DRAM device may hold weights in some of the memory cells instead of using those cells as standard, generic storage locations. Since each memory cell can only store one bit of data, the weight associated with a synapse input is stored in multiple cells, depending on the desired resolution of the weight programming. Further, an ANN-enabled DRAM may allow multiple CSLs to be driven such that multiple sense amplifiers attempt to transfer their data to the same LDL simultaneously. In a state-of-the-art DRAM device, this would lead to a conflict due to the attempt to drive multiple digital signals onto a single data line. For example, any single sense amplifier which stores a "zero" (low voltage) may pull the LDL down to a logical zero level if connected by means of the CSL. The information stored in other sense amplifiers would therefore not contribute to the final outcome and would be lost.

In an ANN-enabled DRAM, however, an LDL amplifier, analog-to-digital converter, and/or other component may distinguish between multiple different analog voltage levels on the LDL. Such an amplifier is shown as "LDL sense and function generator" elsewhere. In addition, the connection of the sense amplifier to the LDL may differ from the configuration of a standard DRAM device such that each digital signal and associated active CSL contributes to the analog signal on the LDL. For example, if four sense amplifiers are connected to the same LDL by means of four active CSLs, the LDL may carry a current or voltage equivalent to one of the sixteen possible combinations of weight data. The above-mentioned data line sense amplifier may identify the signal level and communicate the result in a digital or analog fashion for further processing. The result may be generated by the "function generator" portion of the "LDL sense and function generator" described elsewhere and may be based on various activation functions, such as those known and used in the ANN art. For example, a sigmoid activation function can be used to generate the axon output. This activation function may also be programmable within the memory device. For example, a first read command may activate multiple CSLs associated with memory sense amplifiers and memory cells used to store the activation function parameters. The resulting analog value on the LDL may then be stored in the LDL sense and function generator to act as a reference level for the subsequent neuron activations.

In some embodiments, an ANN-enabled DRAM sense amplifier may distinguish between a sufficient number (e.g., more than two or more than four) of analog levels, in which case the sense amplifier itself may be treated as a neuron and its output may be considered the axon, which could carry either a single digital bit (yes/no decision) or a multi-bit digital or analog value. In some embodiments, an ANN-enabled DRAM data line sense amplifier may additionally or alternatively be considered to be part of a neuron. In this case, its output needs to be further processed with other information gained from other data line sense amplifiers or from the same data line sense amplifier over time through multiple word and/or column select accesses. The combined information may contain a sufficient number of weighted inputs and resolution to determine the final result, which could be considered the axon.

An ANN may contain a few neurons, several million neurons, or even many billions of neurons. The number of neurons relates to the complexity and number of layers of the ANN. The greater the number of neurons, the more complex the artificial network typically becomes to train, and therefore the longer it usually takes to train the network. As a result, it is desirable to have a network that matches the needs of a given problem. One approach to train an ANN is referred to as "gradient descent." To use the gradient descent method to minimize error in outputs produced by an ANN, a function is typically derived for the sum of the output errors given a particular input stimulus and its corresponding expected, "known correct" outputs. The derived function is typically referred to as the "cost function," and the inputs and expected outputs are commonly referred to as "training data." A partial derivative for each weight is computed in order to perform an optimization on the cost function to minimize errors produced by the ANN. By analyzing the partial differential of the weight, a vector for reducing overall error can be determined. The weight is moved in accordance with that vector, and the training continues with further training data until the error produced by the ANN is at or below an acceptable minimized (and preferably minimum) value. There are many functions, as well as step sizes for initial and incremental weight placement, that can be used to optimize training.

In order for ANNs to become practical with a large number of neurons, it is necessary to perform training relatively quickly. Rather than computing the partial derivatives of each of the weights, in some embodiments, a small error value may be introduced into one or more of the weights by using an increment or decrement function in hardware. This moves the value of the weights slightly higher or lower. The training data can then be applied to the network in order to determine whether the total cost function has decreased or increased as a result of the change in the one or more weights. The weight may then be updated if necessary (e.g., if the change resulted in a reduction in error, the weight may be assigned the new value as modified by the error value) and the procedure repeated until the network is fully trained or until error is minimized to an acceptable level. In some embodiments, all data can be held within the device during training and the total cost function error can be derived and held on the device as well. This minimizes input/output requests and power requirements and can significantly expedite the training procedure.

Returning to the example 300, the simple neural network comprises three layers of neurons, layer 1 310, layer 2 320, and layer 3 340. The neural network shown is a fully connected network in that a given neuron of one layer is connected to each neuron in the subsequent layer. Each connection between neurons can comprise a synapse, where each synapse can be associated with a weight or scaling factor. The first layer comprises four neurons, N1 312, N2 314, N3 316, and N4 318. While four neurons are shown in layer 1, other numbers of neurons can be included. The first layer, layer 1 receives as input a vector X comprising four values, X1 350, X2 352, X3, 354, and X4 356. The vector X can include analog values or digital values. Each element of X can be a bit or other size. The outputs of the neurons of layer 1 are connected to the inputs of layer 2. Layer 2 comprises five neurons, N5 522, N6 324, N7 326, N8 328, and N9 330. While five neurons are shown in layer 2, other numbers of neurons could be included. The outputs of the neurons of layer 2 are each connected to the inputs of the neurons of layer 3. The neurons of layer 3 include N10 342, N11 344, N12 346, and N13 348. As for the other layers, the number of neurons in layer 3 may be different from four neurons. The outputs of the neurons of layer 3 comprise an output vector Y. The output vector comprises four values, Y1 350, Y2 352, Y3 354, and Y4 356.

Figure 4:
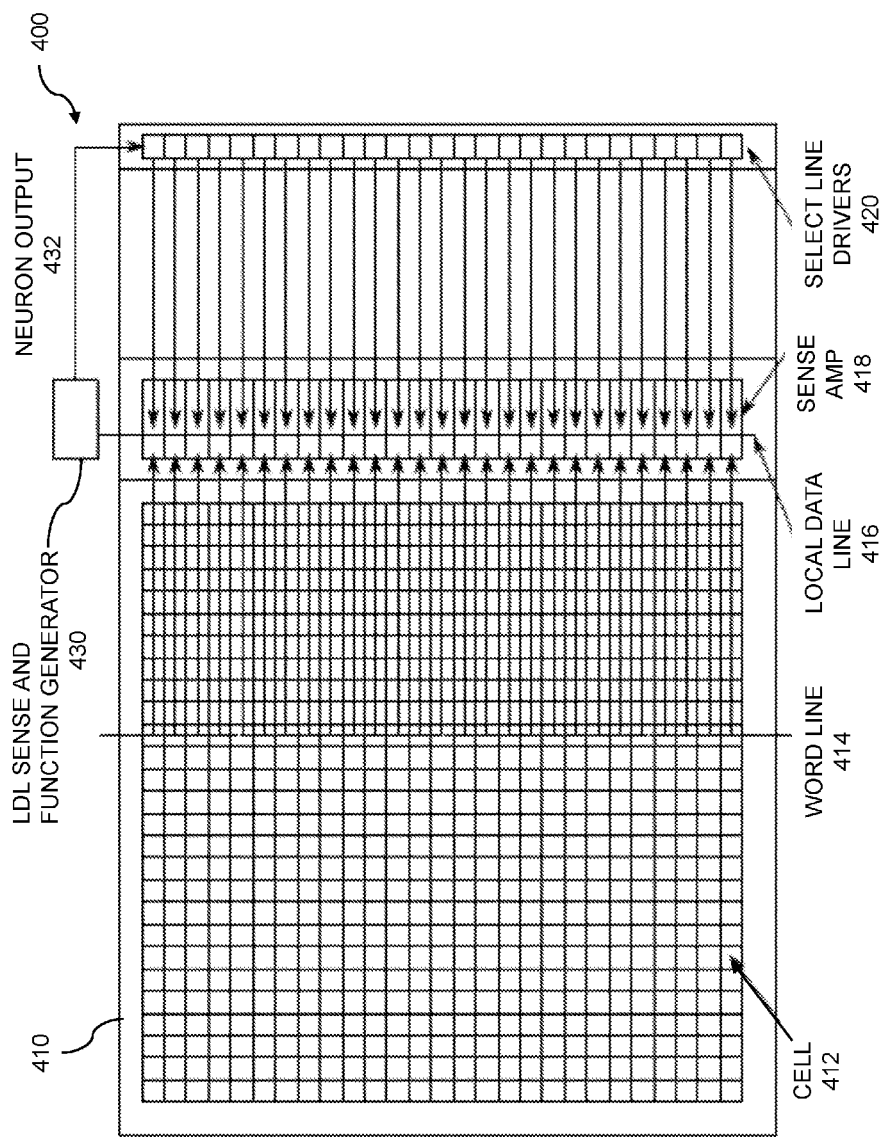
FIG. 4 illustrates an example dynamic random-access memory architecture.

FIG. 4 illustrates an example dynamic random-access memory architecture. Artificial neural network functionality can be implemented within a dynamic random-access memory. An example DRAM with additional circuitry to support an artificial neural network is shown 400. In embodiments, the DRAM and the additional circuitry can implement a single neuron. In some embodiments, a DRAM array 410 may be used to create an ANN that is not only high speed and dense, but also allows a high level of flexibility in how the neurons are interconnected, weighted, and arranged. Weights and biases may be stored digitally in the DRAM array, where the DRAM array comprises a plurality of cells 412. During a row activation using a word line 414, the values of the weights and biases are transferred using a local data line 416 to the sense amplifier 418, just as a traditional DRAM would operate. The weights can be binary encoded at any desired resolution (number of bits). Each group of CSLs and encoded weights may represent one weighted synapse. The number of encoded bits per synapse can vary, e.g., to accommodate (1) a high-resolution weight with relatively fewer synaptic connections or (2) a lower resolution weight with a relatively higher number of synaptic connections. In some embodiments, both a high-resolution weight and a high number of synaptic connections may be used, depending on the specific architecture utilized. The total number of synapses is typically equal to the total number of encoded weights, which are connected via transfer devices to an LDL depending on the inputs to each synapse, represented by the CSL activation. Also connected to the LDL is circuitry that senses the LDL potential and applies a function 430 to drive a line representing the axon. The combination of all the CSLs, the sense amplifiers with weights and bias data, the LDL, and the data line sense circuitry and function generation may comprise one full neuron. The full neuron can be output 432 to control select line drivers 420.

To evaluate a neuron, a pulse with a related signal may be driven along column select signal inputs with the LDL pre-charged high when nFET transistors are used. Alternatively, the LDL may be pre-charged low when pFET transistors are used, as those of ordinary skill in the art will readily appreciate after reading this disclosure in its entirety). One approach to evaluate each encoded weight accurately is to sequentially drive select lines with the same significant bits for respective weights. For example, the first evaluation may comprise driving select lines that are only connected to the least significant bit of the weight. Synapses with their least significant bit weight equal to one will transfer a certain amount of charge onto the LDL that is related to the signal input on the select line. Synapses that have the least significant bit weight equal to zero will not cause a change on the LDL. At the end of the pulse from the select line, the LDL will then represent the total summed input signal from all synapses with the least significant figure weight equal to one. The signal on the data line may then be sensed and stored. The procedure may then be repeated for the next least significant bit and so on until all bits from the weights and biases are stored. The total signal on the data line from all the select line pulses can then be derived and processed by activation function circuitry to drive the output of the neuron, taking into account the significance or bit-weight of each of the stored intermediate results.

Another approach is to vary the voltage or the time of the select line based on the significance, in terms of bit-weight and/or in terms of a static or dynamic priority or importance associated with a particular bit position or group of bit positions, of the bit that it is driving. In this way the bit can be binarily weighted to add more or less charge to the data line based on the significance of the bit. The output of the neuron can then be driven back to the select line drivers and stored (if used as an input to another neuron), as shown elsewhere, or driven off the device (if used as an output of the network). For example, if the weight of each synapse input is encoded with four bits, then there may be four cells and four CSLs associated with each input. In order to give the appropriate significance (in terms of priority or importance) to each bit, the first CSL connected to the least significant (in terms of bit-weight) bit may be active for 1 ns, whereas the other three CSLs for the second, third, and most significant (in terms of priority or importance) bit may then be active for 2 ns, 4 ns, and 8 ns respectively. Thus the amount of charge that could potentially be transferred by one or more of the four bits may be limited in accordance with the significance (in terms of bit-weight and/or in terms of a static or dynamic priority or importance) of each bit. This allows up to sixteen different levels of charge or more to be transferred per synapse input according to the synapse weight programmed into memory through, e.g., a four-bit weight encoding. One or more of the levels of charge may result in the transfer of no charge, which may cause the binary value "0" to appear to be stored in each of the four bits; in some embodiments, this could be treated as a "don't care" condition, thus enabling ternary computing. For example, this may cause that specific synaptic input to be ignored for this neuron. Following the same example, this can additionally or alternatively be achieved by varying the CSL voltage levels, where the highest order (in terms of bit weight) CSL may carry a voltage resulting in, e.g., 8× more current being transferred than through, e.g., a least significant bit (in terms of bit weight) CSL, with the currents for the second and third order bits being, e.g., 4× and 2× the least-significant bit current, respectively. One or more column select pulses may be active for the same duration that a voltage is applied. In some embodiments, dynamic pulses and/or dynamic durations may be utilized based on predetermined, hardcoded, variable, or random input conditions, among others, which may be received from an internal component or an external component, a device, or a user, among others.

Hybrid methods, which may involve: sensing each bit-weight separately for all inputs, using identical CSL pulses and voltages, and/or adding the significance in the function generator; varying the CSL duration depending on the significance (bit-weight and/or priority) of each bit; and/or varying the CSL voltage depending on the significance (bit-weight and/or priority) of each bit, may be advantageous to achieve a high level of both accuracy and speed and an optimal combination of analog and digital processing. In some embodiments, the signal-to-noise ratio may become too low on the LDL if too many synapses are combined with simultaneous sensing of all bit-weights. In these cases it may be necessary to limit the number of synapses and/or use highly sensitive sensing circuitry (e.g., sensing circuitry with an accuracy of 1% to 10%); however, it is noted that less sensitive circuitry may be used in some embodiments.

The significance, in terms of importance or priority, of each bit-location may be hard-coded into the architecture of a memory device if the desired resolution of synapse input weights is known in advance. Additionally, or alternatively, these one or more significances can be programmed through volatile or non-volatile configuration registers by means already provided for all major memory interface standards, for example through mode register set commands. In some embodiments, significances may be utilized based on predetermined, hard-coded, variable, or random input conditions, among others, which may be received from an internal component or an external component, a device, or a user, among others. This permanent or non-permanent choice may thus influence the behavior of the activation function generator and/or one or more CSLs depending on the method or methods used.

In some embodiments, since the DRAM can use activation to repopulate the sense amplifier with new data (here with known weights and biases), it can use the same circuitry as another neuron. In order to propagate through many neurons, many row activations can be performed and the outputs can be stored for use as another select line input. When a new layer in the ANN is desired, the values of the stored outputs of neurons can be (1) driven on select lines of yet more new weights and biases loaded in the sense amplifiers from another row activation and/or (2) shifted from a first register in the CSL driver to a second register so that new neurons can be processed. The order of the row activation, the neuron output storage, and the update of column select signal data is used to configure the connectivity of the ANN. In ANNs it is often seen that the same driver signal goes to many different synapses of neurons. The neural DRAM hardware introduced herein can take advantage of this by driving several wordlines in an array. The select lines may then each be connected to multiple sense amplifiers and in this way many neurons can be evaluated in parallel, optionally using an algorithm for sequential or parallel evaluations like those previously discussed. Additionally, a greater power efficiency and improved performance can be obtained by sharing a single CSL intersect among many sense amplifiers.

By utilizing the DRAM architecture, a user can create a custom ANN having just a few neurons or more than one million neurons and can create and/or automatedly discover custom connectivity between these neurons. A minimal set of devices used to implement aspects of the present disclosure may include a DRAM array, a set of sense amplifiers with select lines, a data line to connect the output of the sense amplifiers, and some circuitry to pre-charge the data line and sense the voltage on the data line.

Figure 5:
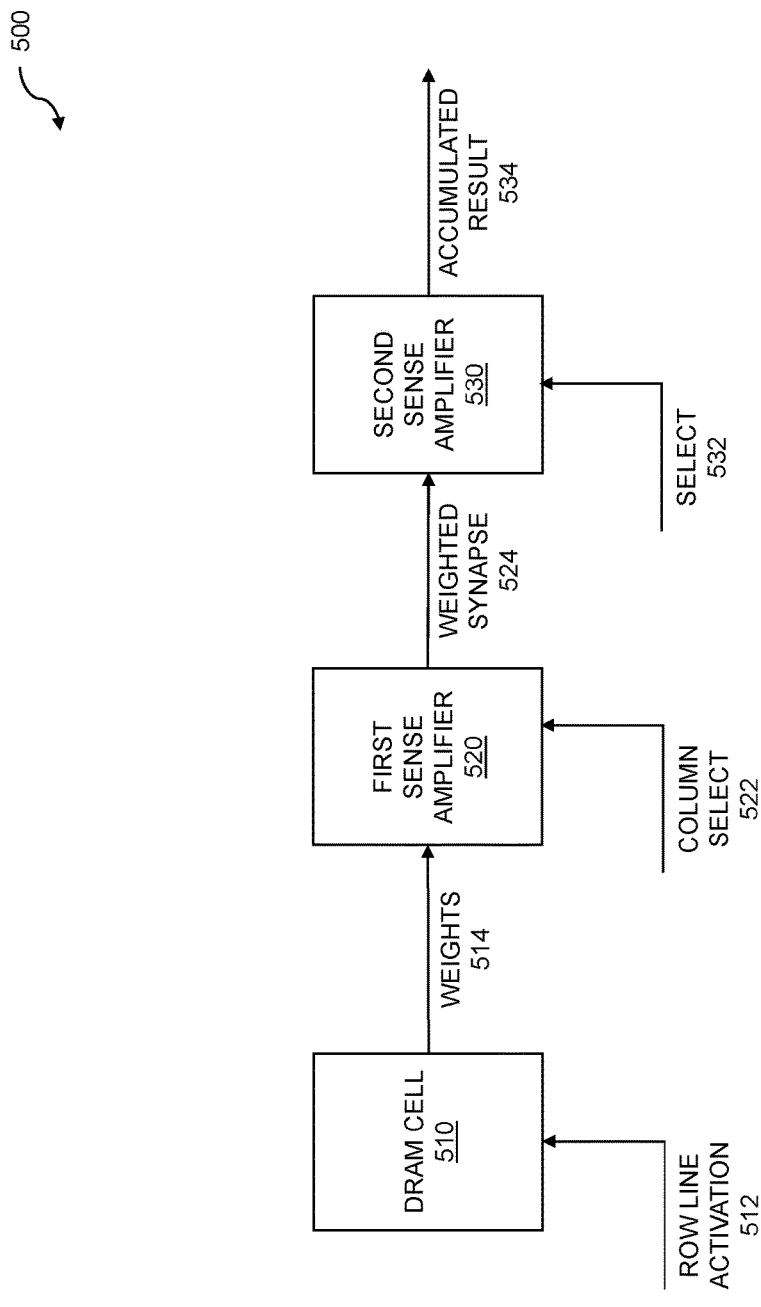
FIG. 5 shows a block diagram for dynamic random-access cell reading.

FIG. 5 shows a block diagram 500 for dynamic random-access cell (DRAM) reading. Reading data from a DRAM enables data such as synapse weights, axons, data, instructions, and so on, to be extracted from the DRAM. Reading data from the DRAM supports artificial neural network (ANN) functionality within dynamic random-access memory. A row line activation 512 accesses data within a DRAM 510. The row line activation can be based on an activation function controlled by the artificial neural network. The row line activation couples data such as weights 514 to the data lines. A first sense amplifier 520 is enabled by a column select 522. In embodiments, the column select can be an analog signal. The column select line can be coupled data switch, as described elsewhere. The results of the sensing by the first sense amplifier can include a weighted synapse 524. A second sense amplifier 530 is enabled by a select 532. In embodiments, the select can be a digital signal. The select can be generated by logic within or coupled to the DRAM. In other embodiments, the second sense amplifier can be activated with an analog signal and output of the second sense amplifier can be a function of a voltage of the analog signal. The second sense amplifier can be used for other purposes within the DRAM. In embodiments, accumulation of a multiply-accumulate function can be accomplished using the second sense amplifier. The multiply-accumulate function can be based on a logical AND operation, where the logical AND operation can be part of a multiplication technique. The second sense amplifier can accumulate results of the multiply-accumulate function and can provide an accumulated result 534.

Figure 6:
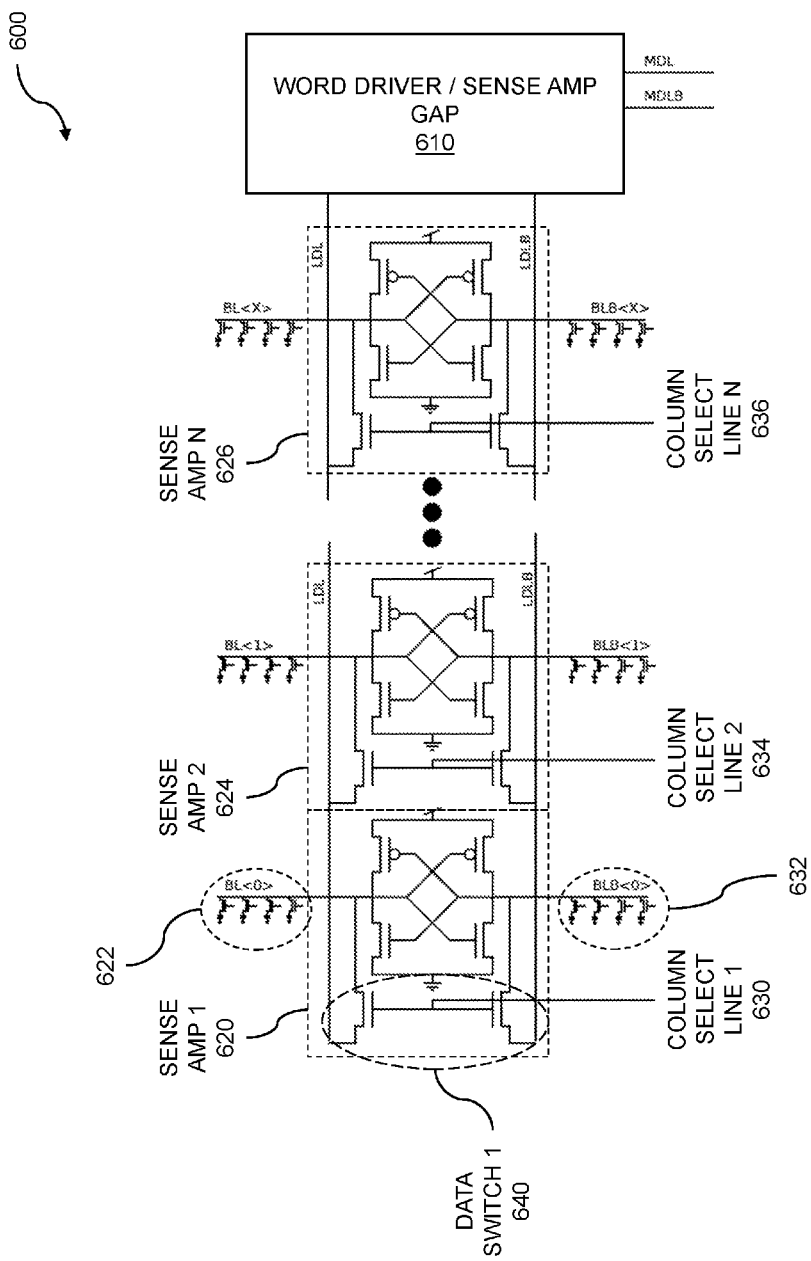
FIG. 6 illustrates a sense amplifier architecture.

FIG. 6 illustrates a sense amplifier architecture. The sense amplifier architecture is used for reading data from a dynamic random-access memory (DRAM) 600. Artificial neural network functionality can be supported within the DRAM. Sets of DRAM cells and their complements, such as set 622 and complement set 632 are shown. The sets of DRAM cells are enabled by bitlines to selectively couple the DRAM cells to sense amplifiers. The set of DRAM cells is connected to bitlines (BL<X> through BL<0>) and complementary bitlines (BLB<X> though BLB<0>), as well as to corresponding primary sense amplifiers connected to the bitlines. In the example, the primary sense amplifiers can include sense amplifier 1 620, sense amplifier 2 624, and sense amplifier N 626. Each column select line (CSL) is connected to a data switch that can transfer data from the primary sense amplifier to the local data line (LDL) and local data line bar (LDLB) data lines. The data switches can be enabled using column select lines. The column select lines can include column select line 1 630, column select line 2 634, and column select line N 636, etc. An example data switch includes data switch 1 640. In a typical DRAM read access, the data from the sense amplifiers is transferred to the LDL and LDLB data lines and then again transferred from the LDL and LDLB data lines to the master data line (MDL) and master data line bar (MDLB) data lines, after which another amplifier would amplify the signal to be driven, e.g., to an off-chip destination. During a typical write operation, data would be provided through the MDL and MDLB data lines, then through the LDL and LDLB data lines, and subsequently transferred to the primary sense amplifier. The data can then be written back to the DRAM cell from the word driver/primary sense amplifier 610.

Figure 7:
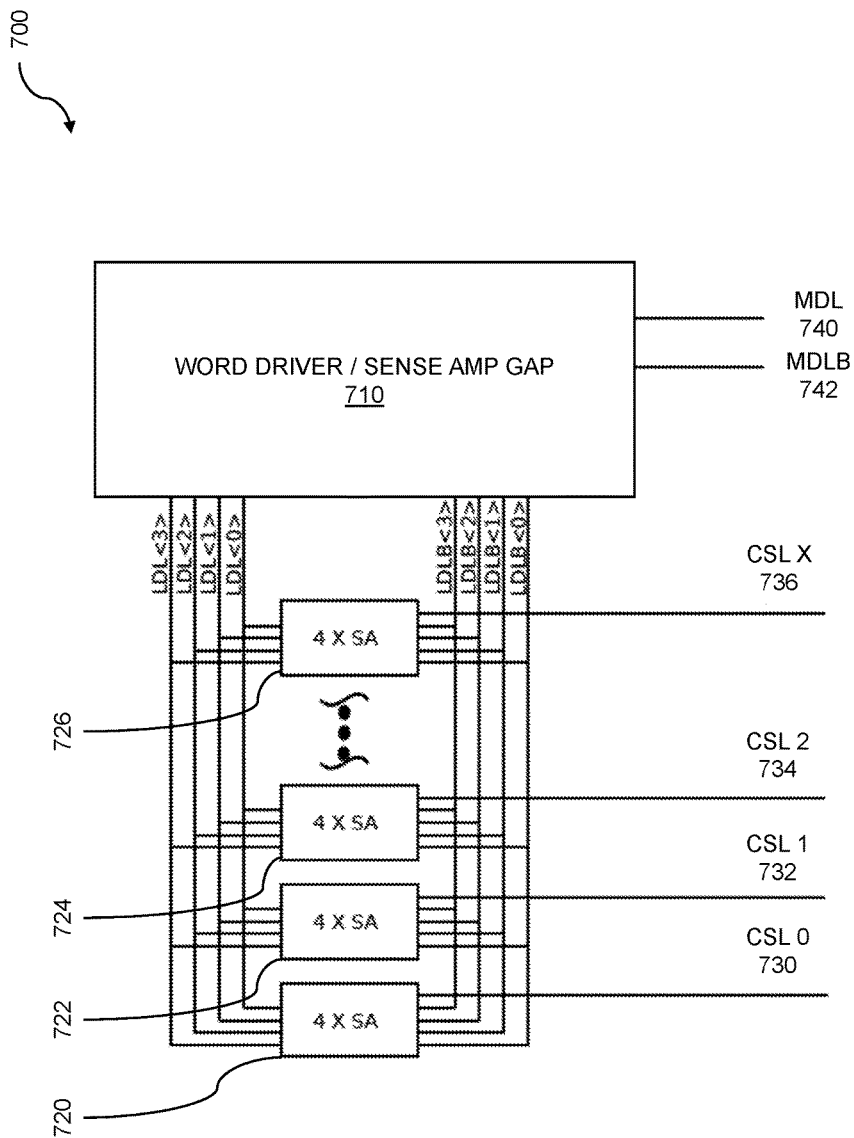
FIG. 7 shows a sense amplifier architecture with multiple local data lines (LDLs).

FIG. 7 shows a sense amplifier architecture with multiple local data lines (LDL) 700. A greater degree of parallelism can be obtained by interfacing each column select line (CSL) switch with a multitude of sense amplifiers 700. The interfacing can include a multitude of local data lines (LDL)/local data line bar (LDLB) data lines with a corresponding multitude of master data line (MDL)/master data line bar (MDLB) data lines. The parallelism can support artificial neural network functionality within dynamic random-access memory.

Different from a typical sense amplifier architecture where a single local data line and its single complement data line are coupled to a word driver, a plurality of local data lines can be coupled to a plurality of word drivers 710. The plurality of word drivers can be coupled to a plurality of master data lines and their complements. Examples of master data lines include master data lines (MDL) 740, and a master data lines bar (MDLB) 742. Column select lines can connect to corresponding groups of sense amplifiers. In the example, the sense amplifiers are grouped in quads. Column select line 0 730 enables sense amplifier quad 720, column select line 1 732 enables sense amplifier quad 722, column select line 2 734 enables sense amplifier quad 724, column select line X 736 enables sense amplifier quad 726, etc. In embodiments, other numbers of sense amplifiers can be grouped as dyads, octads, and so on.

Figure 8:
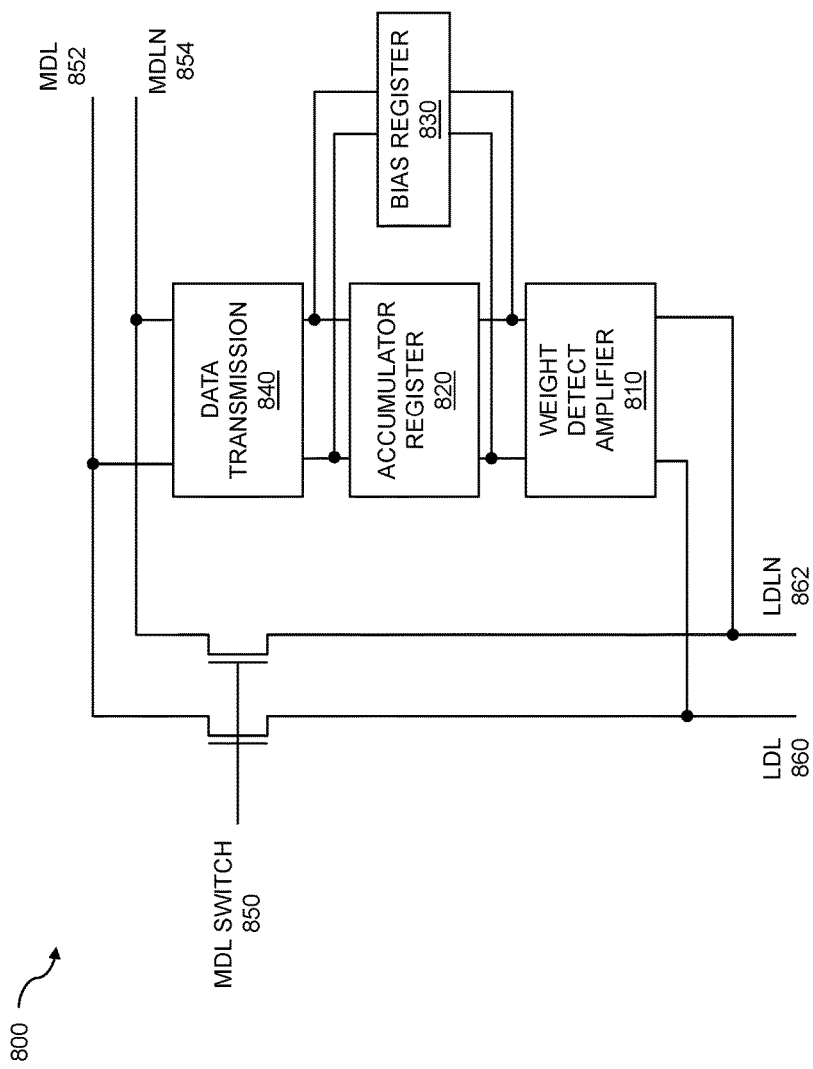
FIG. 8 illustrates weight detection and transmission.

FIG. 8 illustrates weight detection and transmission 800. The sense amplifier can be used by an artificial neural network to enhance functionality within a dynamic random-access memory. As shown in 800, additional circuitry in the gap may comprise a weight detect amplifier 810, an accumulator register 820, a bias register 830, and a data transmission component 840. The weight detect amplifier can amplify the signal developed on the LDL/LDLN lines, 860 and 862 respectively, and can deliver the data to either the accumulator or bias register. Circuitry for typical write and read operations may be realized by simple transistors between the LDL/LDLB and MDL/MDLB lines. The write and read operations for the DRAM can be enabled with a control signal such as the MDL control signal, MDL SWITCH 850.

During evaluation of a neuron, CSLs may be enabled one at a time. As a group of CSLs may represent a neuron, each CSL in the group can be assigned a bit significance. When one of the CSLs is enabled, the data can be transmitted to the LDL/LDLN lines. The weight detect amplifier 810 can sense the result of the data, and if the value of the data is zero, which would be the case when the weight for that bit is also zero, nothing is added to the accumulator. If the value of the data is one, however, the accumulator 820 may increment its value by (or as a function of) the data value multiplied by the significance of the bit assigned to the corresponding CSL. All CSLs can be enabled in a similar fashion, resulting in data being summed in the accumulator. In this sense, a perceptron (i.e., a neuron with a binary output) can be realized. To allow for compatibility with other activation functions, the CSL can be enabled for a given time based on the amount of signal driven on the CSL. For example, a clock may be used to sense a data line sixteen different times on the same CSL activation. If the CSL signal is small, then the CSL may only be high for a few of the sixteen samples. However, if the CSL signal is large, then the CSL may remain high for a majority of the sixteen samples. This can also be realized in an inverted fashion to save power and increase speed, where a small signal would only result in the CSL remaining low for a short time; once activated (high), sensing of the voltage may cease. A large signal on the CSL would cause the CSL not to activate for a longer amount of time. In this way, an input on a group of CSLs can be multiplied by weights stored in DRAM cells, and the result may be held in an accumulator and optionally incremented as a function of the data resulting from other groups of CSLs being multiplied by other weights. In some embodiments, a set of CSLs can be enabled and resulting data can be stored in a bias register 830. The stored value in the bias register can then be used as a bias that is applied to the neuron. The resulting data stored in the accumulator and bias register can then be transferred to circuitry outside of the DRAM array but close to the CSL drivers, such as where a secondary sense amplifier and write driver may be located, which are typically used for reading and writing operations in a DRAM. The data transferring can be accomplished using data transmission 840.

Figure 9:
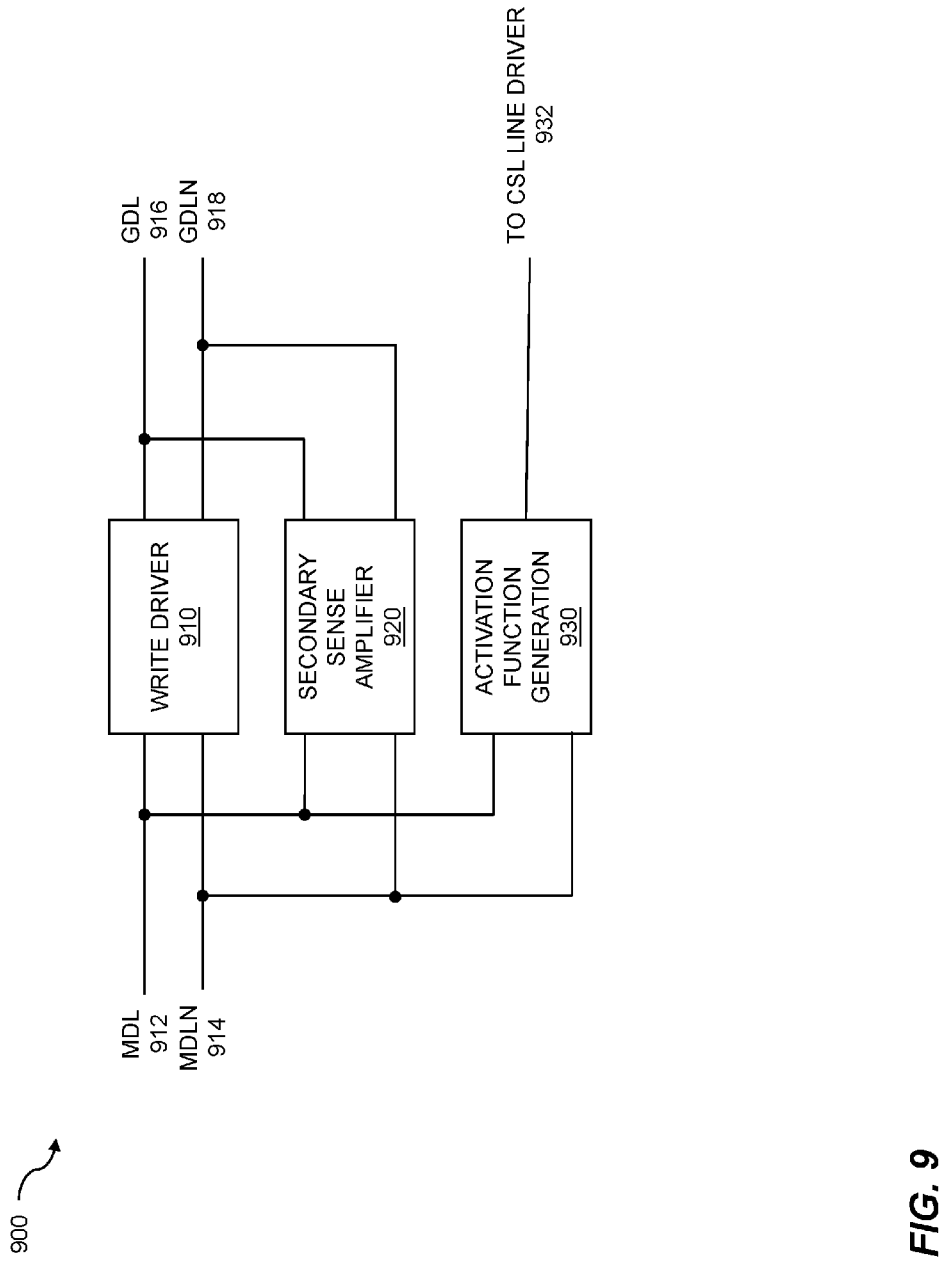
FIG. 9 shows a secondary sense amplifier and write driver region.

FIG. 9 shows a secondary sense amplifier and write driver region 900. An input with a signal on a group of column sense lines can be multiplied by weights previously stored in DRAM cells while a large signal is present on the CSL lines. The results of the multiplications can be held in an accumulator located in a word driver/sense amplifier gap. The held results are accumulated with other groups of CSLs multiplied by other weights. The sense amplifier and write driver region enable artificial neural network functionality within dynamic random-access memory. In some embodiments, a set of CSLs can be enabled and the resulting data can be stored in a bias register as described elsewhere. This value can be used as a bias that is applied to the neuron. The resulting data stored in the accumulator and bias register can then be transferred to circuitry located outside of the DRAM array but close to the CSL drivers. The circuitry located outside of the DRAM array can include a write driver 910 and a secondary sense amplifier 920. The write driver and the secondary sense amplifier can be used for reading and writing operations in a DRAM. The write driver and the secondary sense amplifier can use inputs master data line (MDL) 912 and master data line not (logical NOT) (MDLN) 914, and can generate outputs global data line (GDL) 916 and global data line not (GDLN) 918. Additional circuitry in this location may include an activation function generator 930. The activation function generator can in some aspects accumulate values from other MDL/MDLN outputs, such as MDL 912 and MDLN 914, to increase the number of synaptic inputs. The activation function generator can process the sum from the accumulator along with a bias register to produce a final output (axon) of the neuron. Various different activation functions can be used, such as sigmoid or hyperbolic tangent functions. The resulting output can include a CSL line driver signal 932. The resulting output 932 can either be driven off-chip (e.g., as an output) or transferred to the CSL driver region for use as an input to another neuron.

Figure 10:
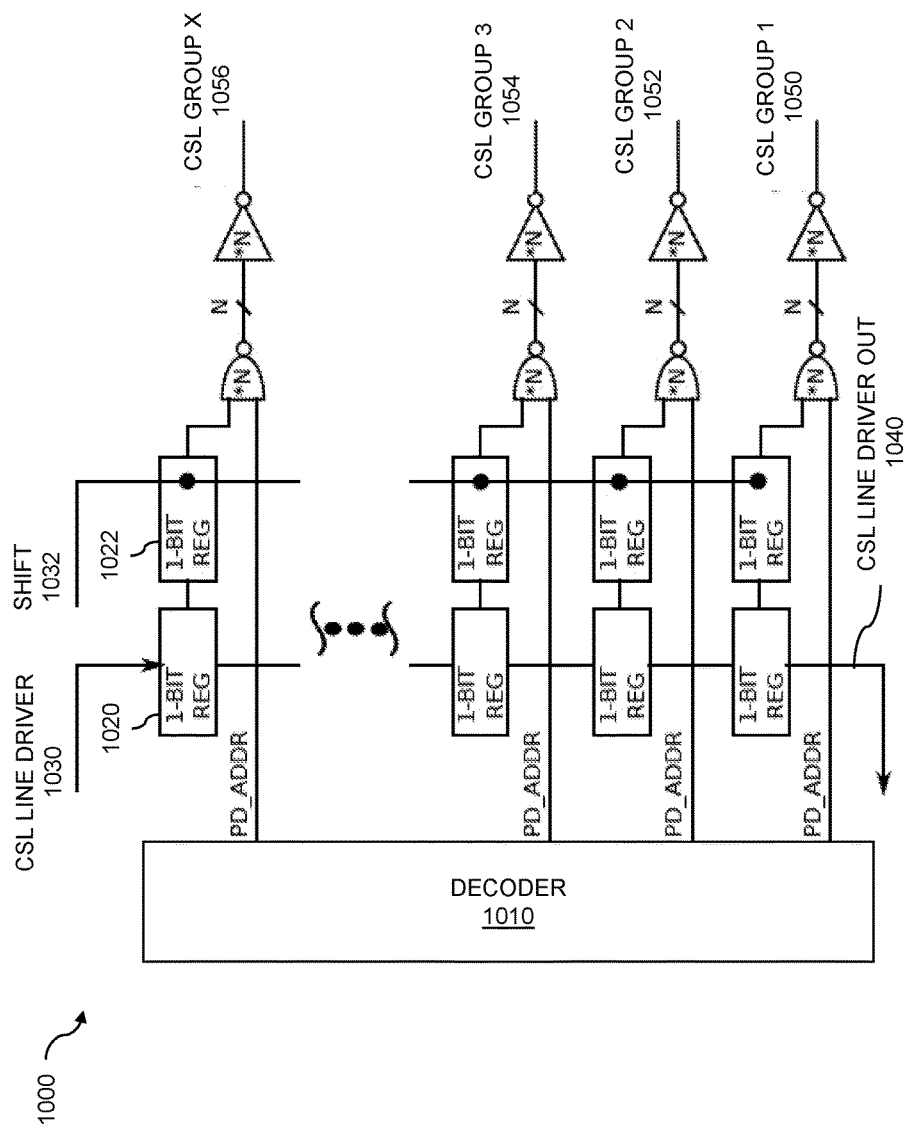
FIG. 10 illustrates an example column select line driver as a perceptron.

FIG. 10 illustrates an example column select line driver as a perceptron. A column select line (CSL) can be used to implement a perceptron model or other activation function 1000. The perceptron model or other activation function can support artificial neural network functionality within dynamic random-access memory. The output of the perceptron model or other activation function can be binary. Other functions can be defined where the input to the neuron can be represented by a binary set of CSL lines multiplied by a binary set of weights. A set of registers can be selected by a decoder 1010. The output of a neuron can be transmitted to a first register such as a 1-bit register 1020, where the transmitting can be accomplished using a technique such as a scan chain. The input to the scan chain can be provided by a CSL line driver 1030. The input to the scan chain can be propagated to other 1-bit registers using a CSL line driver out signal 1040. The first register can be used to hold data that will be used for a layer other than the layer currently being processed. A second register 1022 can be used to shift data from the first register for use in driving the CSL. The shifting of the second register can be accomplished using a shift signal 1032. Each CSL line can be addressed independently and can be evaluated by a logical AND function along with the second register, which can represent either the input signal (if it is the first layer of the network) or the output of another neuron. This provides great flexibility for interconnection of the neurons. The CSL line can be buffered and coupled to CS lines within the DRAM. The CLS lines can include groups such as CSL group 1 1050, CSL group 2 1052, CSL group 3 1054, CSL group X 1056, and so on.

Figure 11:
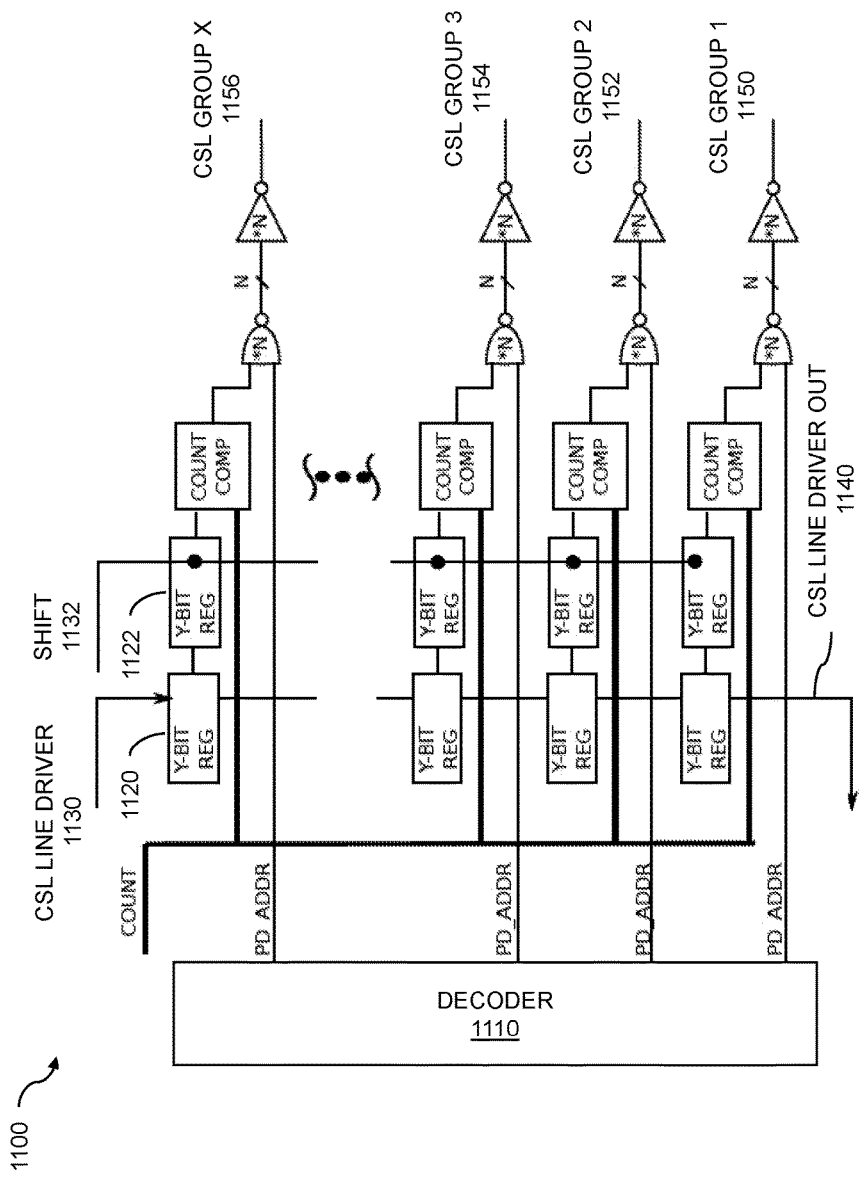
FIG. 11 is an example showing a column select line driver driving a signal.

FIG. 11 is an example showing a column select line (CSL) driver driving a signal. A CSL driver can be used to realize activation functions 1100. The activation functions can include functions other than binary axons (e.g., n-ary axons). The CSL line driver used to drive a signal can support artificial neural network functionality within dynamic random-access memory. A Y-bit register such as 1120 can be used in place of the single bit register as previously described. The Y-bit register can be enabled by an output from a decoder such as decoder 1110. A clock signal can be applied, where the clock signal can include a CSL line driver signal 1130. The CSL line driver input can be passed along to other Y-bit registers using a CSL line driver output 1140. The CSL line driver can be generated by an activation function, as described elsewhere. A clock can be applied to enable the column select line CSL for a number of clock cycles (or a portion of each) corresponding to the value stored in the Y-bit register. For example, if the Y-bit register contains a small value, the CSL may be enabled only during a few clock cycles; however, if the Y-bit register has a high value, the CSL may be enabled for a majority of the clock cycles. In this way, a variable amount of signal can be driven on the CSL. As with the 1-bit register described previously, a first and second Y-bit register 1122 can be used to store the output of one layer while the current layer is being processed. Layers can be selected by shifting, where shifting can use a shift input 1132. When a count of clock cycles is complete, column select line groups can be enabled. Column select line groups can include CSL group 1 1150, CSL group 2 1152, CSL group 3 1154, CSL group X 1156, and so on. In some embodiments, a combination of column select lines, registers, sense amplifiers, weights, bias data, a local data line, a weight detect amplifier, an accumulator, a bias register, and function generation component may comprise one full neuron. With multiple LDLs, multiple neurons can be realized. Additionally, many such neuron structures can exist on a single chip and can be evaluated in parallel, and the outputs of each can be connected to inputs of others.

Through-silicon via (TSV) technology offers benefits by allowing both a large amount of parallelism among semiconductor devices and also a very short interface distance for connections among them. Aspects of this disclosure may be beneficially realized with TSV technology, such as pairing neurons with an imaging semiconductor or other sensor or any number of other devices. Aspects of this disclosure can also be used in embedded applications where ultra-low power processing is desired. For example, there are significant advantages to using aspects of this disclosure for mobile processing. Cloud computing and large data centers have great interest in efficient power usage for semiconductor devices. Aspects of this disclosure have significant advantages over other data center technologies, such as allowing very high speed ultra-parallel processing while using very little power. The neural architecture described herein is not limited to a standalone device and may be part of another system or multiple systems. The architecture can also potentially be used in a parallel configuration with multiple devices to increase network flexibility. A minimal set of devices used to implement aspects of the present disclosure may include a DRAM array, a set of sense amplifiers with select lines associated with programmable registers that can control activation of the select lines, a data line to connect the output of the sense amplifiers together circuitry to sense the data on the data line, circuitry to accumulate data from the data line, circuitry to associate significance information with certain select lines, and circuitry to apply a function based on the accumulated result.

DRAM typically aims to store data sent during write cycles and to return it in an unaltered condition during read cycles, with the storage location within the memory being determined by address information furnished along with a respective write or read command. The memory is unable to act upon the data beyond refreshment of the dynamic memory cell contents or in rare cases restoration and repair of faulty data. This occurs by design, in order to fulfill the memory's assigned function within traditional computer architectures such as von Neumann or Harvard. One disadvantage of this is that all the data must be funneled through the memory device's input and output (I/O) connections, which requires relatively high-power consumption despite enabling only limited throughput. The DRAM-internal structures allow for a significantly wider or more parallel data access than can be supported through the device's I/O ports. In order to exploit this feature of the DRAM-internal structures, the present inventors have designed an internal data processing capability that allows combinational multiplications to be executed by the memory device itself with great advantage for certain applications, such as in the fields of neuromorphic computing and artificial intelligence.

Figure 12:
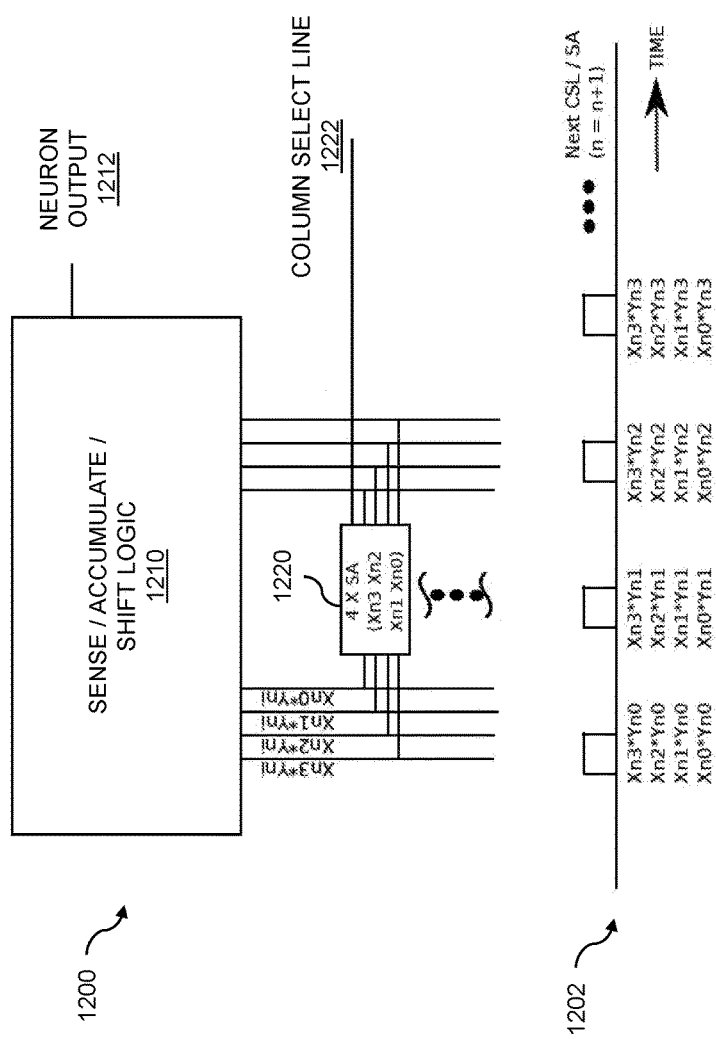
FIG. 12 illustrates a four-bit combinational multiplier.

FIG. 12 illustrates a four-bit combinational multiplier. A combinational multiplier, whether based on one bit, two bits, four bits, eight bits, and so on, can be used for artificial neural network functionality within dynamic random-access memory. A four-bit combinational multiplier 1200 can be implemented using a modified DRAM memory architecture. As discussed elsewhere, combinational multiplication can be performed through sequential application of input data Yn to associated weights Xn. The input data Yn can be sequentially applied, such as a sequential bit-wise application to a column select line 1222, to sense amplifiers 1220. The partial products can be observed and accumulated in sense/accumulate/shift logic 1210, where the sensing, accumulating, and shifting logic can include an accumulator. Subsequent values for "n" can add additional full products of xn*yn to the accumulator. In this way, the sum of all products xn*yn can be calculated and provided as an input to an off-chip device or another on-chip circuit.

In one embodiment, the DRAM memory storage cells contain one operand, "x," of the multiplication, where the column select lines (CSL) contain the other operand, "y." The wordline selects a set of memory storage cells from among a larger amount of memory cells within a memory array such as the DRAM array. The memory cells are connected to sense amplifiers 1220, with one sense amplifier per selected memory cell. Normally, the sense amplifier is selected for read or write operations through the activation of an associated CSL, which connects it to a local input/output line. This embodiment differs in that a secondary sense amplifier capable of sensing the result of an AND operation is selectively imposed between the memory cell content stored in the sense amplifier and the associated column select line. The result is the product "x*y", or "xy", with x and y being single bit binary numbers. Contrary to typical DRAM operation, the CSL activation is not based on an address (where one specific CSL will always be activated to access the data stored in memory), but the CSL activation itself is based on various data, including the possibility that no CSL may be activated at all. The aforementioned secondary sense amplifier therefore needs to accurately identify this as a valid logic state. This again differs from a traditional DRAM architecture, which may use differential data lines as input for the secondary sense amplifier, where one input line will always be activated, or pulled low, for a normal read event. One solution is to implement a single-ended input secondary sense amplifier that is pre-charged before the read event to a known state which can then be pulled to a voltage level indicating the opposite state depending on the xy product result. Differential solutions may be implemented by one of ordinary skill in the art but may require additional circuitry or additional memory bits for each bit of "x" information. In any case, the product xy can be made available at the secondary sense amplifier as single-bit binary information and may be combined with other values, or other such identically generated products, from different areas of the memory in order to perform the first step of a combinational multiplication. The desired final multiplication result, or neuron output 1212, is the product of x(n) and y(m), with integers "n" and "m" representing the desired bit-count for the respective product operand. In order to minimize the memory usage, consecutive bits of y(m) are applied to the CSLs, repeatedly accessing the same "x" information until all the requisite combinations of xy have been successfully evaluated.

When the product x(n)y(m) has been determined, it may be stored or referred to as z(k) 1212, with k=m+n. One or multiple z(k) values may be further processed through a function, which in the field of neuromorphic computing is often referred to as an activation function. The output of the activation function is often used to represent the axon of an artificial neuron. Together with the inputs y(m) and their weighing through x(n) for each input to the neuron, with one or more such inputs and associated weights being present, a DRAM-based artificial neural network can be implemented where all computations are contained within the DRAM itself without using traditional ALU-based computation and without transportation of unprocessed DRAM memory data. In fact, contrary to a state of the art DRAM, in some embodiments, the memory cell contents are known only to a downstream device or neuron to the extent that the product xy may suggest their possible logic states. This allows a significant reduction in data transport, further enhanced by a significant increase in parallelism, as the same input data y may be applied to several memory array regions simultaneously, with each representing different neuron inputs and associated weights.

In embodiments, the second sense amplifier can be activated with a pulse. A series of pulses, and the multiplications that can take place contemporaneously with the series of pulses, is shown 1202. The output of the second sense amplifier can be a function of pulse duration. It is possible and advantageous to implement the combinational multipliers and activation functions within the DRAM architecture. Further, it is possible to implement a multitude of layers for an artificial neural network (ANN) all within the DRAM such that the output of the activation function is utilized as new y'(m) input data. By switching the row activation of the memory array and sensing the new data with the primary sense amplifiers, a new set of weights x'(n) can be made available for the next layer of neuron calculations. It is of great advantage that the above described circuit structures can be reused for consecutive layers through sequential evaluation. In this manner, a deep neural network may be implemented, using the typically large amount of storage available in DRAM memory to store the various weights for each neuron's inputs while minimizing the overhead required by the additional combinational multipliers and activation function circuits. In fact, one layer of neurons can be evaluated in sequential order if desired to further minimize the circuit overhead at the expense of time for the ANN evaluation. Nevertheless, the state-of-the-art DRAM architecture with its multiple banks of memory, distributed data path components, and distributed secondary sense amplifiers can be very useful for achieving a high degree of parallelism for the described ANN logic circuits, thus ensuring sufficient and competitive performance.

Figure 13:
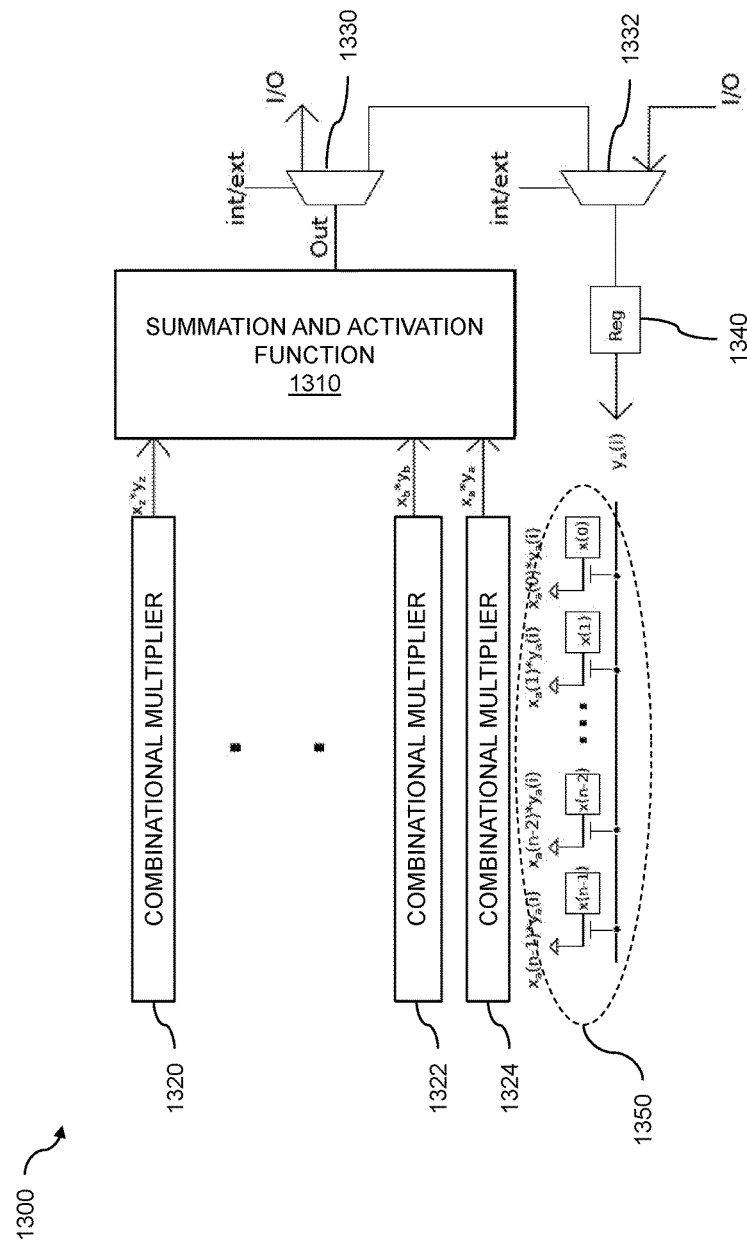
FIG. 13 shows multiply-accumulators for synapse evaluation.

FIG. 13 shows multiply-accumulators for synapse evaluation. In neural networks as described here, an input vector or set of values X can be used to compute an output vector or set of values Y, based on weights such as synaptic weights. The synaptic weights can support artificial neural network functionality within dynamic random-access memory. The input X and the output Y can be described as interconnected within the neural network. The synaptic weights can be represented by a matrix. The output vector Y can be computed using $y_j = \Sigma_i w_{ij} x_i$. The multiplication and addition shown in the equation can be computed using digital logic. A plurality of multipliers such as combinational multipliers can be used in parallel to simultaneously compute products or partial products based on synaptic weights or synapses of one or more neurons. While combinational multipliers are shown, other types of multipliers such as those based on carry-look-ahead, carry-select, Booth encoding, and the like, can be used. The one or more neurons can be included in a neural network such as an artificial neural network (ANN), a convolutional neural network (CNN), and so on.

A multiply accumulate technique including a plurality of parallel multipliers is shown 1300. Each neuron within a neural network can receive inputs from external sources or from other neurons internal to a semiconductor device. Each neuron can send its output to other off-chip, semiconductor devices and/or to internal synaptic inputs. A summation and activation function 1310 can accumulate partial products and can provide outputs. The outputs from the simulation and activation function can be fanned out, buffered, steered, directed, selected, and so on 1330, to another neuron or can feed back, such as a partial product or other value, for further computation. The output from 1310 or an input external to the neuron can be selected 1332 and loaded into a register 1340. In this example, the stored values can represent the Y vector. A bit from the Y vector can be distributed along a select line to enable a bit of the X vector 1350 to enter a plurality of combinational multipliers. The bits of the X vector can include from least significant bit x(0), x(1), and so on up to x(n−1). The plurality of combinational multipliers can include 1320, 1322, 1324, and so on. The outputs of the combinational multipliers can be accumulated by the summation and activation function 1310.

Figure 14:
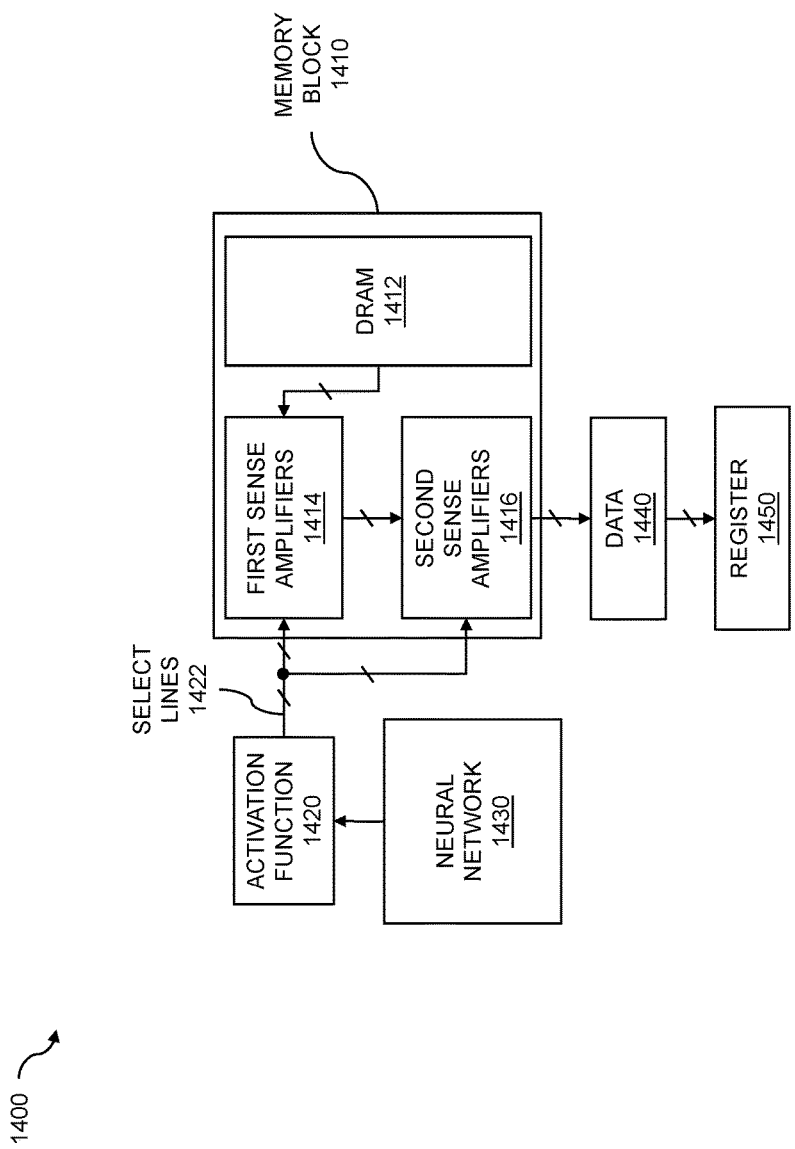
FIG. 14 illustrates a block diagram for artificial neural network functionality within a dynamic random-access memory.

FIG. 14 illustrates a block diagram for artificial neural network functionality within a dynamic random-access memory. A block diagram 1400 can represent a system, an apparatus, and so on for data calculation. The data calculation can support artificial neural network functionality, where the artificial neural network functionality can be within a dynamic random-access memory. A plurality of dynamic random-access cells is accessed within a memory block. Data within the plurality of dynamic random-access cells is sensed using a plurality of sense amplifiers associated with the plurality of dynamic random-access cells. A plurality of select lines coupled to the plurality of sense amplifiers is activated to facilitate the sensing of the data within the plurality of dynamic random-access cells wherein the activating is a function of inputs to a layer within a neural network, and wherein a bit within the plurality of dynamic random-access cells is sensed by a first sense amplifier and a second sense amplifier within the plurality of sense amplifiers. Resulting data is provided based on the activating wherein the resulting data is a function of weights within the neural network.

The block diagram includes a memory block 1410. The memory block can include a memory such as a dynamic random-access memory (DRAM) 1412. The DRAM can store instructions, values, parameters, weights such as synapse weights, and so on. The information within the DRAM can be selected, as discussed below. The information selected within the DRAM can be sensed using one or more first sense amplifiers 1414. In embodiments, an n-type transistor can be used to connect the sense amplifier to the shared line, wherein a first voltage is higher than a second voltage wherein an n-type transistor can be used to connect the first sense amplifier to the shared line. Other types of connections can be made between the sense amplifier and the shared line. In embodiments, a p-type transistor can be used to connect the sense amplifier to the shared line, and wherein the first voltage is lower than the second voltage. The sensing of the information can include an analog technique, a digital technique, or both techniques.

The information selected within the DRAM can be further sensed using one or more second sense amplifiers 1416. In embodiments, the first sense amplifier or the second sense amplifier can be activated with a digital signal. The digital signal can be determined by an activation function 1420, where the activation function can be manipulated by a neural network 1430. The neural network can include an artificial neural network (ANN), a deep neural network (DNN), a convolutional neural network (CNN), etc. The digital signal can include activation of one or more select lines 1422. In other embodiments, the second sense amplifier can be activated with an analog signal and the output of the second sense amplifier can be a function of a voltage of the analog signal. The analog signal can be applied using a variety of techniques. In embodiments, the analog signal can be applied to the second sense amplifier by a select line from the plurality of select lines. Other types of signals can be used to activate the second sense amplifier. In further embodiments, the second sense amplifier can be activated with a pulse and output of the second sense amplifier can be a function of pulse duration.

As discussed, information within the DRAM can be accessed using a variety of selection techniques such as one or more bit lines, column select lines, etc. In embodiments, the accessing of the plurality of dynamic random-access cells can be accomplished by data compare. Data can be compared with other data where the other data may have been previously loaded into a memory. In embodiments, the data compare can include a content-addressable memory access (CAM). The accessing of the DRAM cells can be accomplished based on a successful compare of data with contents of the CAM. In embodiments, the data compare is used for row activation as part of the accessing the plurality of dynamic random-access cells. The activation of a row comprises access to a plurality of bits within the DRAM. The bits to be sensed can be selected by a plurality of select lines, such as select lines 1422. In embodiments the select lines can be driven sequentially or simultaneously. A signal on a shared line can be modified by the first sense amplifier and the second sense amplifier before the shared line is reset or pre-charged. At least one of the select lines can be configured to be driven by a signal selectively having a first voltage or a second voltage, wherein the first voltage can connect one sense amplifier to the shared line for sensing one single bit per shared line and the second voltage can connect a plurality of sense amplifiers simultaneously to the same shared line. In this way, the shared line carries an analog signal which is directly dependent on data stored in the plurality of memory cells associated with the connected plurality of sense amplifiers. Embodiments further include activating one or more select lines from the plurality of select lines such that a voltage is applied to a data line as a function of one or more synapse weights.

Resulting data 1440 can be provided based on the activating of the plurality of select lines. The resulting data can include instructions, values, parameters, etc. The resulting data can be a function of weights within the neural network. As previously discussed, the weights within the neural network 1430 can be used by the activation function 1420 to activate the select lines 1422. The resulting data 1440 can be stored in a register 1450. The register can include a register file, an accumulator, and so on. The data can represent intermediate data, a partial sum, a partial product, etc. In embodiments, the resulting data can be included in a multiply-accumulate function. Multiplication can be accomplished based on the mathematical principal that multiplication equals repeated addition, such as 4×3=4+4+4. For larger numbers, such as 42×15, the product can be determined by multiplying 42×5 to compute a first partial product, "shifting" left, then multiplying 42×10 to compute a second partial product. The partial products can be added together to compute the product: 42×15=210+420=630. When the numbers being multiplied, the multiplicand and the multiplier, are binary numbers, then the "multiplication" to compute the partial products can be computed using a logical AND operation. That is 1×1=0, or 1 AND 1=1. The multiplication and the adding can be accomplished with a multiply-accumulate technique, where a new partial product is added to the sum of prior partial products. In embodiments, the multiply-accumulate function is based on a logical AND operation of data within the dynamic random-access cells and the plurality of select lines. Data can be applied to the memory block. The activating a plurality of select lines can be based on this data. The accumulation of data, partial sums, partial products, etc. in the register 1450 can be accomplished using a sense amplifier. In embodiments, accumulation of the multiply-accumulate function is accomplished using the second sense amplifier 1416. In other embodiments, multiplication of the multiply-accumulate function can be accomplished using the second sense amplifier.

In embodiments, a system for data calculation includes: a neural network comprising multiple layers; a memory block comprising a plurality of dynamic random-access cells that are accessed; a plurality of sense amplifiers, associated with the plurality of dynamic random-access cells, used in sensing data within the plurality of dynamic random-access cells; a plurality of select lines that are activated and coupled to the plurality of sense amplifiers to facilitate the sensing of the data within the plurality of dynamic random-access cells, wherein activation is a function of inputs to a layer within the plurality of layers of the neural network, and wherein a bit within the plurality of dynamic random-access cells is sensed by a first sense amplifier and a second sense amplifier within the plurality of sense amplifiers; and a register containing resulting data based on the activation wherein the resulting data is a function of weights within the neural network.

In other embodiments, an apparatus for data calculation comprises: a plurality of dynamic random-access cells within a memory block that are accessed; a plurality of sense amplifiers associated with the plurality of dynamic random-access cells, wherein the plurality of sense amplifiers are used in sensing data within the plurality of dynamic random-access cells; a plurality of select lines, coupled to the plurality of sense amplifiers, activated to facilitate the sensing of the data within the plurality of dynamic random-access cells, wherein activation is a function of inputs to a layer within a neural network, and wherein a bit within the plurality of dynamic random-access cells is sensed by a first sense amplifier and a second sense amplifier within the plurality of sense amplifiers; and a register that contains resulting data based on the activation wherein the resulting data is a function of weights within the neural network.

Each of the above methods may be executed using one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"— may be implemented by computer program instructions, by special-purpose hardware-based computer systems, by combinations of special purpose hardware and computer instructions, by combinations of general purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited neither to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the described functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A method for data calculation comprising:
accessing a plurality of dynamic random-access cells within a memory block;
sensing data within the plurality of dynamic random-access cells using a plurality of sense amplifiers associated with the plurality of dynamic random-access cells;
activating a plurality of select lines coupled to the plurality of sense amplifiers to facilitate the sensing of the data within the plurality of dynamic random-access cells wherein the activating is a function of inputs to a layer within a neural network wherein a bit within the plurality of dynamic random-access cells is sensed by a first sense amplifier and a second sense amplifier within the plurality of sense amplifiers; and
providing resulting data based on the activating wherein the resulting data is a function of weights within the neural network.

2. The method of claim 1 wherein the resulting data include neuromorphic computing data.

3. The method of claim 1 wherein the accessing of the plurality of dynamic random-access cells is accomplished by data compare.

4. The method of claim 3 wherein the data compare is used for row activation as part of the accessing the plurality of dynamic random-access cells.

5. The method of claim 1 further comprising adding the resulting data to previous data that was obtained through accessing the plurality of dynamic random-access cells.

6. The method of claim 1 wherein the second sense amplifier is activated with a digital signal.

7. The method of claim 1 wherein the second sense amplifier is activated with an analog signal and output of the second sense amplifier is a function of a voltage of the analog signal.

8. The method of claim 7 wherein the analog signal is applied to the second sense amplifier by a select line from the plurality of select lines.

9. The method of claim 1 wherein the second sense amplifier is activated with a pulse and output of the second sense amplifier is a function of pulse duration of the pulse.

10. The method of claim 1 wherein the resulting data is included in a multiply-accumulate function.

11. The method of claim 10 wherein the multiply-accumulate function is based on a logical AND operation of data within the dynamic random-access cells and the plurality of select lines.

12. The method of claim 11 wherein accumulation of the multiply-accumulate function is accomplished using the second sense amplifier.

13. The method of claim 1 wherein the select lines are driven sequentially or simultaneously such that a signal on a shared line is modified by the first sense amplifier and the second sense amplifier before the shared line is reset or pre-charged wherein at least one of the select lines is configured to be driven by a signal selectively having a first voltage or a second voltage, wherein the first voltage is utilized for connecting one sense amplifier to the shared line for sensing one single bit per shared line and the second voltage is used for connecting a plurality of sense amplifiers simultaneously to the same shared line such that the shared line carries an analog signal directly dependent on data stored in the plurality of memory cells associated with the connected plurality of sense amplifiers.

14. The method of claim 13 wherein an n-type transistor is used to connect the sense amplifier to the shared line, and wherein the first voltage is higher than the second voltage wherein an n-type transistor is used to connect the first sense amplifier to the shared line.

15. The method of claim 13 wherein a p-type transistor is used to connect the sense amplifier to the shared line, and wherein the first voltage is lower than the second voltage.

16. The method of claim 1 further comprising activating one or more select lines from the plurality of select lines such that a voltage is applied to a data line as a function of one or more synapse weights.

17. The method of claim 1 further comprising determining an axon output as a function of a select line voltage where the select line is from the plurality of select lines.

18. The method of claim 17 further comprising providing the axon output to a synapse input.

19. The method of claim 17 wherein determining an axon output comprises sensing a voltage on the data line during a plurality of separated time periods before the data line is reset or pre-charged.

20. The method of claim 17 wherein determining the axon output further comprises sensing a voltage on one of the select lines during a plurality of separated time periods before the select line is reset or pre-charged.

21. The method of claim 17 further comprising multiplying the axon output by a weight associated with one of the select lines.

22. The method of claim 1 further comprising sensing a voltage on the data line and determining whether to add a value to an accumulator register as a function of the sensed voltage.

23. The method of claim 1 further comprising applying a voltage to at least one of the select lines for a period of time, wherein the period of time is determined as a function of a synapse input signal.

24. The method of claim 1 further comprising applying a voltage to at least one of the select lines, wherein the voltage is determined as a function of a synapse input signal.

25. A system for data calculation comprising:
a neural network comprising multiple layers:
a memory block comprising:
   a plurality of dynamic random-access cells that are accessed;
   a plurality of sense amplifiers, associated with the plurality of dynamic random-access cells, used in sensing data within the plurality of dynamic random-access cells;
   a plurality of select lines that are activated and coupled to the plurality of sense amplifiers to facilitate the sensing of the data within the plurality of dynamic random-access cells, wherein activation is a function of inputs to a layer within the plurality of layers of the neural network, wherein a bit within the plurality of dynamic random-access cells is sensed by a first sense amplifier and a second sense amplifier within the plurality of sense amplifiers; and
   a register containing resulting data based on the activation wherein the resulting data is a function of weights within the neural network.

26. An apparatus for data calculation comprising:
a plurality of dynamic random-access cells within a memory block that are accessed;
a plurality of sense amplifiers associated with the plurality of dynamic random-access cells, wherein the plurality of sense amplifiers that are used in sensing data within the plurality of dynamic random-access cells;
a plurality of select lines, coupled to the plurality of sense amplifiers, activated to facilitate the sensing of the data within the plurality of dynamic random-access cells, wherein activation is a function of inputs to a layer within a neural network, wherein a bit within the plurality of dynamic random-access cells is sensed by a first sense amplifier and a second sense amplifier within the plurality of sense amplifiers; and
a register that contains resulting data based on the activation wherein the resulting data is a function of weights within the neural network.

* * * * *